(12) United States Patent
Gonzalez

(10) Patent No.: US 10,069,030 B2
(45) Date of Patent: Sep. 4, 2018

(54) LOAD LOCK SOLAR CELL TRANSFER SYSTEM

(71) Applicant: SolarCity Corporation, San Mateo, CA (US)

(72) Inventor: Pablo Gonzalez, Fremont, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/985,294

(22) Filed: Dec. 30, 2015

(65) Prior Publication Data

US 2017/0170356 A1 Jun. 15, 2017

Related U.S. Application Data

(60) Provisional application No. 62/267,240, filed on Dec. 14, 2015.

(51) Int. Cl.
*H01L 21/677* (2006.01)
*H01L 31/18* (2006.01)
(Continued)

(52) U.S. Cl.
CPC .......... *H01L 31/18* (2013.01); *H01L 21/6773* (2013.01); *H01L 21/67201* (2013.01); *H01L 21/67303* (2013.01); *H01L 21/67309* (2013.01); *H01L 21/67313* (2013.01); *H01L 21/67373* (2013.01); *H01L 21/67379* (2013.01);
(Continued)

(58) Field of Classification Search
CPC ................ B25J 15/0028; B25J 15/0206; B25J 15/0616; B25J 15/0625; B25J 15/0633; B25J 15/0641; H01L 21/67766; H01L 21/67769; H01L 21/67778; H01L 21/68707
See application file for complete search history.

(56) References Cited

U.S. PATENT DOCUMENTS 4,599,037 A * 7/1986 Ross, Jr. .............. B25J 15/0616
29/740
4,705,311 A * 11/1987 Ragard ................. B23P 19/007
29/740
(Continued)

FOREIGN PATENT DOCUMENTS

KR 20100104175 A 9/2010

*Primary Examiner* — Gerald McClain
(74) *Attorney, Agent, or Firm* — Kilpatrick Townsend & Stockton LLP

(57) ABSTRACT

Systems and methods for transferring solar cells while maintaining a controlled micro-environment are provided. In particular, such systems provide automated loading and unloading of solar cells by use of a conveyor and elevator within a tank receptacle sealingly connected with a solar cell carrying pods and a flow tube of solar cell components in a solar cell fabrication process. The tank receptacle can include one or more ports for sealingly and operably coupling with a cover of a solar cell carrying pod, each port having an elevator for withdrawing a removable base of the pod along with a solar cell carrying cassette into the tank and a conveyor to facilitate loading and/or unloading of solar cells with the cassette by coordinated movement of the elevator and conveyor. Such systems can further include a robotic arm having a gripper and nozzle to maintain a micro-environment within the pod during transport.

19 Claims, 31 Drawing Sheets

(51) Int. Cl.
*H01L 21/687* (2006.01)
*H01L 21/67* (2006.01)
*H01L 21/673* (2006.01)

(52) U.S. Cl.
CPC .. *H01L 21/67386* (2013.01); *H01L 21/67393* (2013.01); *H01L 21/67757* (2013.01); *H01L 21/67766* (2013.01); *H01L 21/67772* (2013.01); *H01L 21/67778* (2013.01); *H01L 21/68707* (2013.01)

(56) References Cited

U.S. PATENT DOCUMENTS

| | | | | |
|---|---|---|---|---|
| 4,705,444 A | * | 11/1987 | Tullis | H01L 21/67772 118/729 |
| 4,770,599 A | * | 9/1988 | Hawkswell | H05K 13/0413 294/2 |
| 4,781,511 A | * | 11/1988 | Harada | H01L 21/67772 118/50 |
| 4,995,430 A | * | 2/1991 | Bonora | H01L 21/67373 141/383 |
| 5,156,521 A | * | 10/1992 | Crabb | C30B 29/06 118/719 |
| 5,363,867 A | * | 11/1994 | Kawano | H01L 21/67772 414/940 |
| 5,469,963 A | * | 11/1995 | Bonora | G03F 1/66 206/454 |
| 5,570,990 A | * | 11/1996 | Bonora | H01L 21/67775 414/744.2 |
| 5,573,023 A | * | 11/1996 | Thompson | H01L 21/6708 134/147 |
| 5,709,519 A | * | 1/1998 | Uehara | H01L 21/67775 104/36 |
| 6,152,669 A | * | 11/2000 | Morita | H01L 21/67772 414/217 |
| 8,225,496 B2 | | 7/2012 | Bachrach et al. | |
| 8,322,509 B2 | | 12/2012 | Yokoo et al. | |
| 8,415,967 B2 | | 4/2013 | Lee et al. | |
| 8,738,174 B2 | | 5/2014 | You et al. | |
| 8,851,819 B2 | * | 10/2014 | Kamikawa | H01L 21/67727 414/222.07 |
| 8,981,204 B2 | | 3/2015 | Johnson, Jr. et al. | |
| 2006/0251499 A1 | | 11/2006 | Lunday et al. | |
| 2011/0245957 A1 | | 10/2011 | Porthouse et al. | |
| 2013/0109189 A1 | | 5/2013 | Cho et al. | |
| 2013/0171757 A1 | | 7/2013 | Ponnekanti et al. | |
| 2016/0325946 A1 | * | 11/2016 | Stopper | H01L 21/67736 |

\* cited by examiner

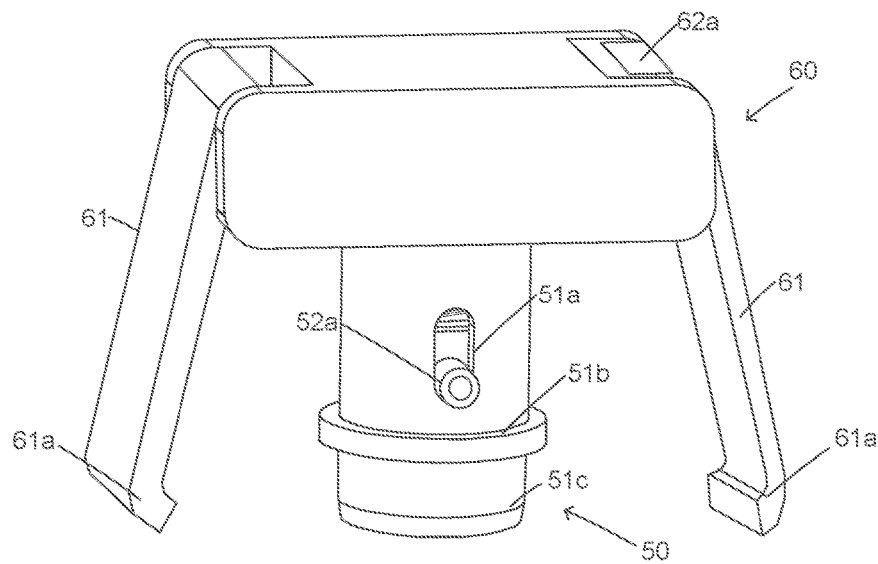
FIG. 8A
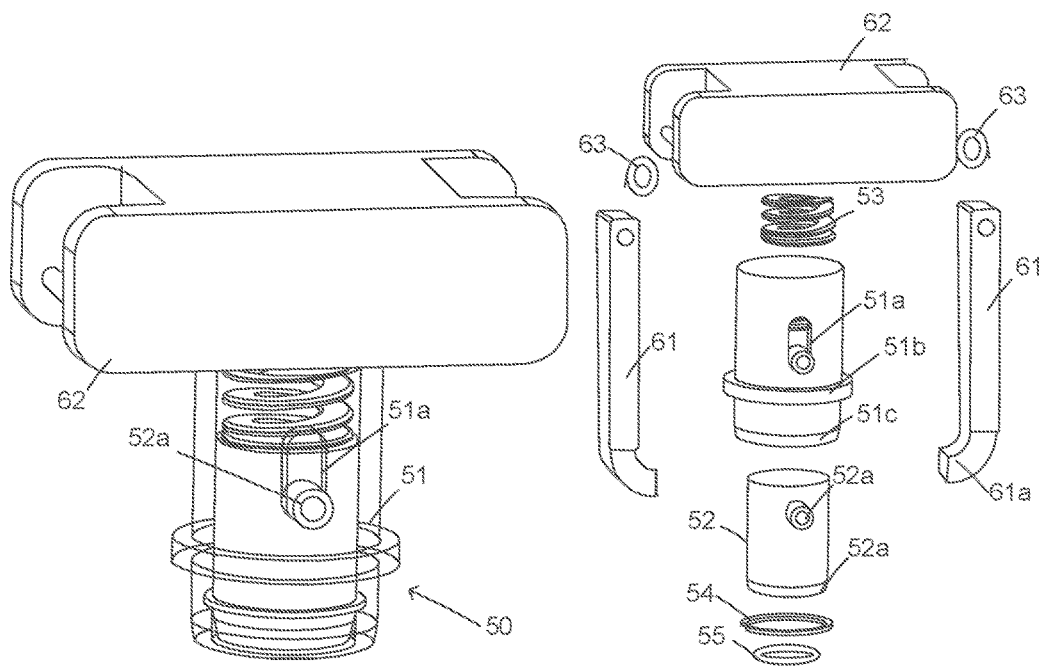
FIG. 8B
FIG. 8C

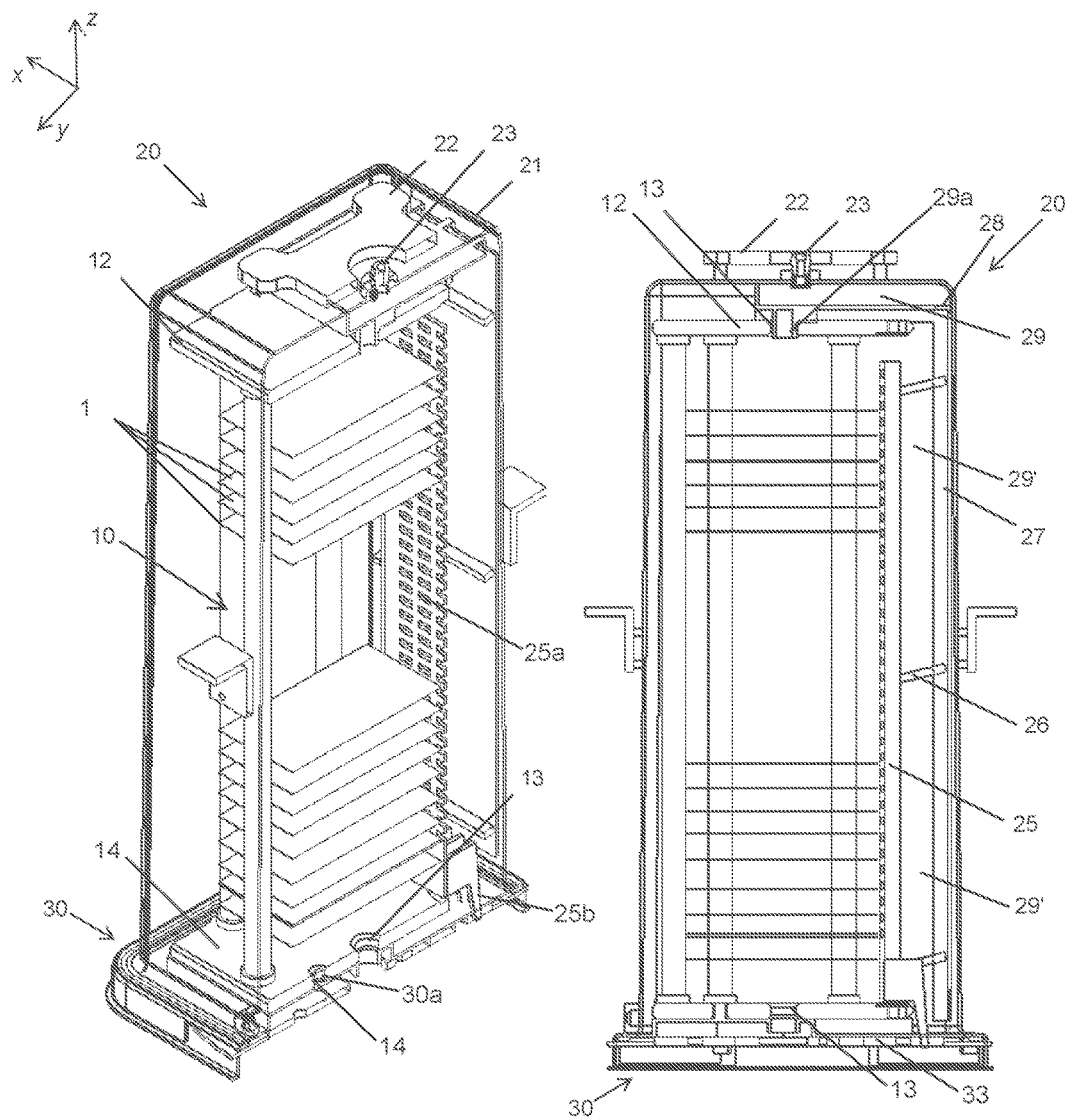

US 10,069,030 B2

LOAD LOCK SOLAR CELL TRANSFER SYSTEM

CROSS REFERENCE TO RELATED APPLICATIONS

This claims the benefit of priority of U.S. Provisional Patent Application No. 62/267,240 filed on Dec. 14, 2015 the entire contents of which are incorporated herein by reference.

This is related to U.S. Non-Provisional patent application Ser. No. 14/985,284 and Ser. No. 14/985,260; each of which is filed concurrently herewith and incorporated herein by reference in its entirety

FIELD OF THE INVENTION

This relates to devices, systems and methods that facilitate transfer and storage of solar cells. More specifically, this is related to an automated transfers of solar cells between a solar cell fabrication line and solar cell carrying pods while maintaining a sealed and controlled environment to avoid degradation of solar cell components.

BACKGROUND

Advances in photovoltaic technology, which are used to make solar panels, have helped solar energy gain mass appeal among those wishing to reduce their carbon footprint and decrease their monthly energy costs. However, the panels are typically fabricated manually, which is a time-consuming and error-prone process that makes it costly to mass-produce reliable solar panels.

Conventional approaches for fabricating solar cells often require the entire fabrication process for a particular solar cell to be performed with minimal delays between process steps since even brief exposure to ambient air triggers degradation of solar cell components by oxidation. If such delays are unavoidable, solar cell components are typically placed on a tray and stored in a large storage container that must be purged of ambient air and filled with an inert gas such as nitrogen. Even this approach, however, can result in some degradation of solar cell components since purging a large storage container can be time-consuming and studies have shown that measurable degradation occurs within 6 minutes of exposure to ambient environment. In addition, since storage of solar cell components typically utilizes a high-grade of Nitrogen, such purging and filling of large storage containers can become cost prohibitive, thereby limiting the number of solar cells that can be efficiently transferred and stored without degradation occurring. These difficulties make large-scale production of solar cells challenging since large-scale production may require process steps to be performed at different times and/or locations necessitating delays between process steps. Therefore, it would be desirable to develop systems and methods that allow for transfer and/or storage of solar cell components quickly and efficiently while avoiding oxidation and degradation of solar cell components. It would be further desirable if such systems and methods allowed for transfer of large volumes of solar cells between locations and automation so as to facilitate large-scale fabrication of solar cells.

BRIEF SUMMARY

In one aspect, the invention provides a solar cell transfer system that includes a tank receptacle that is sealingly coupleable with a tube having a controlled environment through which solar cell components are conveyed in a fabrication line. The tank receptacle can include one or more ports, each port sealingly coupleable with a solar cell carrying pod to facilitate transport of one or more solar cells between the solar call carrying pod and the fabrication line. Each port is associated with an elevator and adjacent conveyor. The elevator is adapted to securely couple with a removable base of the solar cell carrying pod and withdraw the removable base and cassette attached to the removable base into the receptacle while a cover of the solar cell carrying pod remains sealingly coupled to the tank receptacle to facilitate transport of the solar cells while maintaining a controlled environment. The movable conveyor is configured to extend toward the cassette after withdrawal of the removable base and to convey the one or more outgoing solar cells for transport between the cassette and the fabrication line. Transport of the solar cells can include unloading of one or more incoming solar cells from a cassette of the solar cell carrying pod and/or loading of one or more outgoing solar cells into the cassette of the solar cell carrying pod. Typically, the solar cell transfer tank includes at least two ports: an incoming port for transporting the one or more incoming solar cells from a respective solar cell carrying pod, and an outgoing port for transporting the one more outgoing solar cells to a respective solar cell carrying pod.

In various embodiments, the system can include a control unit configured to control movement of each of the conveyor and the elevator such that movement of the elevator coordinated with conveying movement of the conveyor extended towards the cassette effects loading and/or unloading of the one or more solar cells.

In various embodiments, the elevator of the solar cell transfer system can include an actuator positioned on an elevator platform to engage a gear mechanism of the removable base to effect removal and/or replacement of the base from the solar cell carrying pod positioned atop the elevator platform. The actuator can be a motor-driven collet adapted to expand into a rotatable collar operably coupled with a gear system within the removable base that effects removal and/or replacement of the base of the solar cell carrying pod from the pod cover. Typically, the lock actuation mechanism is incorporated into the movable elevator platform.

In various embodiments, the solar cell transfer system can include a robotic arm having a gripper for facilitating placement and removal of a solar cell carrying pod from a port of the receptacle. The gripper includes at least two distally extending gripper jaws adapted to close on a handle disposed atop the solar cell carrying pod, the at least two gripper jaws being movable between an open position for receiving the handle and a closed position for grasping the handle. Movement of the gripper jaws is effected by a gripper actuation mechanism. In various embodiments, the at least two movable claw members are biased in the open position and the actuation mechanism comprises a sleeve that slides over the at least two gripper jaws to move the at least two gripper jaws towards each other as the sleeve is distally advanced. The gripper actuation mechanism can be configured such that movement of the sleeve is pneumatically actuated or by any other suitable actuation means.

In various embodiments, the gripper can further include a nozzle adapted to sealingly couple with a valve disposed atop the solar cell carrying pod to facilitate maintaining a controlled environment within the solar cell carrying pod. The nozzle can include a circumferential seal along a distal nozzle opening for sealing against a valve boss surrounding the valve when the gripper is coupled with the handle of the solar cell carrying pod.

In various embodiments, the solar cell transfer tank can include a lip seal circumscribing each of the ports to facilitate sealing of a cover of the solar cell carrying pod with the respective port. A clamp mechanism is disposed on a receptacle housing adjacent each of the ports. Each clamp mechanism can include a finger that pressingly engages an outer surface of the solar pod sufficiently to seal the cover against the receptacle housing about the port. In various embodiments, the clamp mechanism can include a base attached to a housing of the receptacle, a movable arm pivotally coupled to the base and a rod extending distally from the movable arm and defining the finger for engaging the outer surface of the respective solar cell carrying pod. Movement of the clamp mechanism can be motor-driven by the control unit in response to a sensor output indicating that the solar cell carrying pod is disposed atop the port in a suitable position for sealing and clamping with the clamp mechanism.

In various embodiments, the system can include one or more sensors for determining a status and/or location of a respective solar cell carrying pod or the removable base of the respective solar cell carrying pod relative the respective port. An output of each of the one or more sensors is coupled with the control unit such that movement of the removable base into the receptacle and/or movement of the conveyor is based on data from the one or more sensors. The one or more sensors can include: a sensor adapted for determining when a solar cell carrying pod is sealingly coupled to the port; a sensor adapted for determining a location of a cassette attached to the removable base of a respective solar cell carrying pod when withdraw into the receptacle; and a sensor adapted for determining a location of a respective solar cell of the one or more solar cells during unloading from a cassette and/or loading onto a cassette, or any combination thereof.

In various embodiments, the solar cell transfer system can include a gas sealed transfer tank having a port that is sealingly engageable with a cover of a solar cell carrying pod. The cover is sealingly and removably coupled to a base that is attached with a solar cell carrier. The tank can further include an elevator within the tank adjacent the port. The elevator is engageable with the base of the solar cell pod and configured to remove the base from the solar cell carrying pod and withdraw the base and attached solar cell carrier into the tank while the cover is sealingly engaged with the port. The tank can further include a conveyor disposed at least partly within the tank for conveying solar cells to the solar cell carrier to allow incremental loading and/or unloading of solar cells within the solar cell carrier by coordinated movement of the conveyor and the elevator within the tank while maintaining a gas seal within the cover of the solar cell carrying pod.

The system can further include a robotic arm having a distal gripper with integrated nozzle, the robotic arm adapted for positioning each of the solar cell carrying pods for coupling with the tank, the robotic arm including a distal gripper with an integrated nozzle to establish or maintain a slight positive or negative pressure micro-environment with the pod filled with an inert gas concurrent with transport of the solar cell carrying pod with the gripper.

In various other embodiments, the solar cell transfer system can include a gas sealed transfer tank having an outgoing conveyer and an incoming conveyer. The system further can include a first elevator disposed within the tank adjacent the incoming conveyer and is engageable and gas sealed with a first solar cell carrying pod having incoming solar cells, which can include a cover and a base having a solar cell carrier or cassette. The first elevator is adapted to remove the base of the first solar cell carrying pod and withdraw the base into the tank to incrementally unload solar cells held by the solar cell carrier onto the incoming conveyer while maintaining a gas seal with the cover of the first solar cell carrying pod, and then reseal the base to cover after the cells are loaded. A second elevator is disposed within the tank adjacent the incoming conveyer and is engageable and gas sealed with a second solar cell carrying pod, which can include a cover and a base having a solar cell carrier. The second elevator is configured to remove the base of the second solar cell carrying pod and withdraw the base into the tank to incrementally load solar cells from the outgoing conveyer while maintaining a gas seal with the cover of the second solar cell carrying pod, and then reseal the base to cover after loading.

In various embodiments, the tank can include a first port adapted for sealingly coupling with a cover of the first solar cell carrying pod having one or more incoming solar cells and a second port adapted for sealingly coupling with the cover of the second solar cell carrying pod having one or more outgoing solar cells, Each of the elevators can include an elevator platform that couples with the removable base of a respective solar cell carrying pod. In various embodiments, each of the elevator platforms is adapted to seal the respective port when the port is not coupled to the cover of a respective solar cell carrying pod.

BRIEF DESCRIPTION OF THE DRAWINGS

FIGS. 8A-8E illustrate various views of a gripper and nozzle device of the robotic arm in accordance with various embodiments.

FIGS. 11A-11C illustrates various views of the solar cell carrying pod in FIG. 10A with the cover housing shown transparent.

DETAILED DESCRIPTION

The present invention seeks to ameliorate some if not all of the shortcomings of the prior art by use of a load lock transfer system that allows for transfer of solar cell components while maintaining the integrity of the solar components during transport. Advantageously, the system and methods described within are amenable to automation and provide a controlled environment of inert gas during loading and/or unloading while minimizing or eliminating costly purging thereby making transfer and storage of large volumes of solar cells during large-scale fabrication more feasible.

Referring now to FIGS. 1A-7, these figures illustrate various view of an exemplary solar cell transfer system adapted to facilitate transfer of solar cell components between locations while maintaining a controlled environment allowing for efficient automation of processes.

Figure 1A:
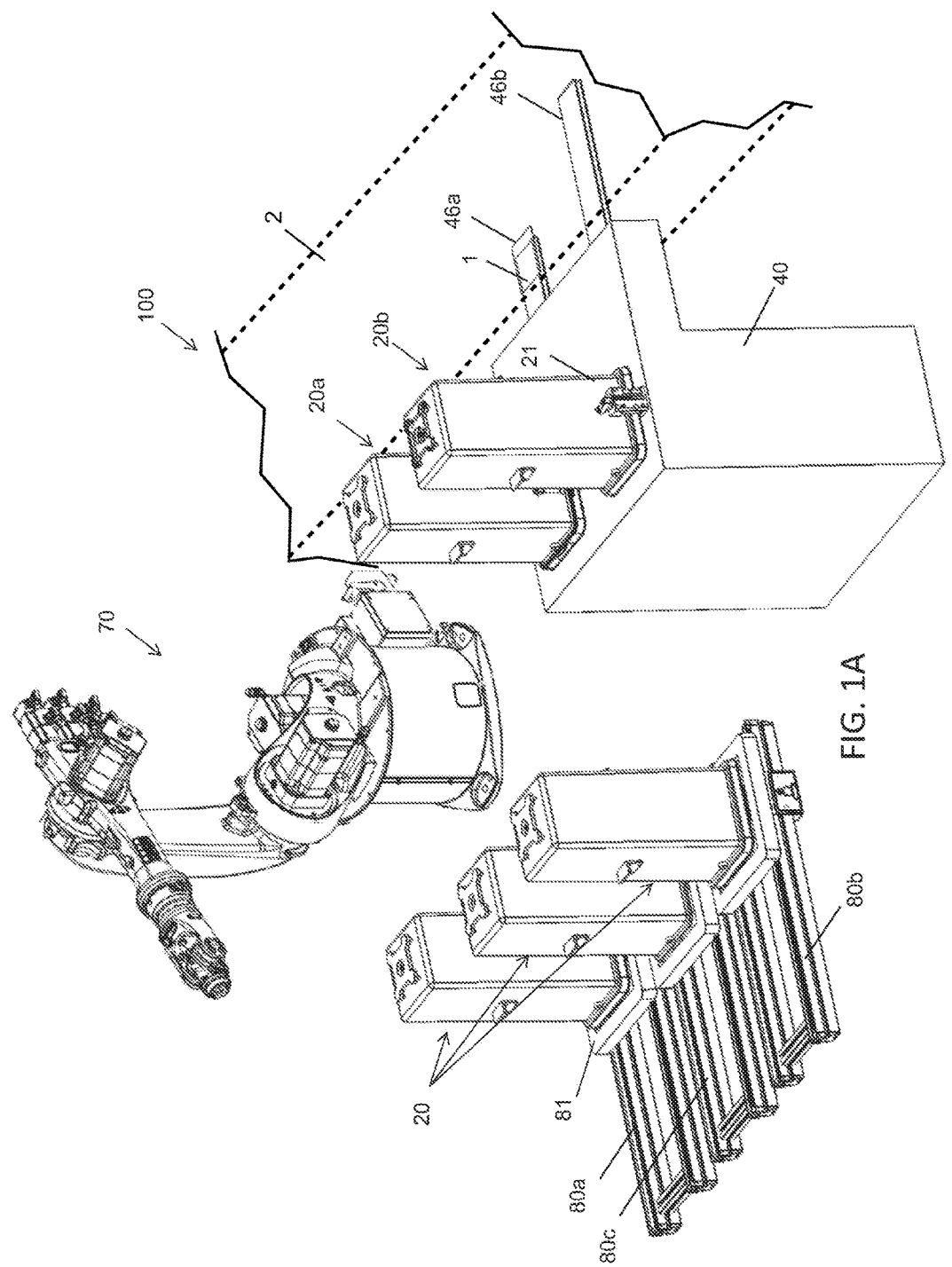
FIG. 1A illustrates a load lock solar cell transfer system for maintaining a controlled environment during transport of solar cells in accordance with various exemplary embodiments of the invention.
Figure 1B:
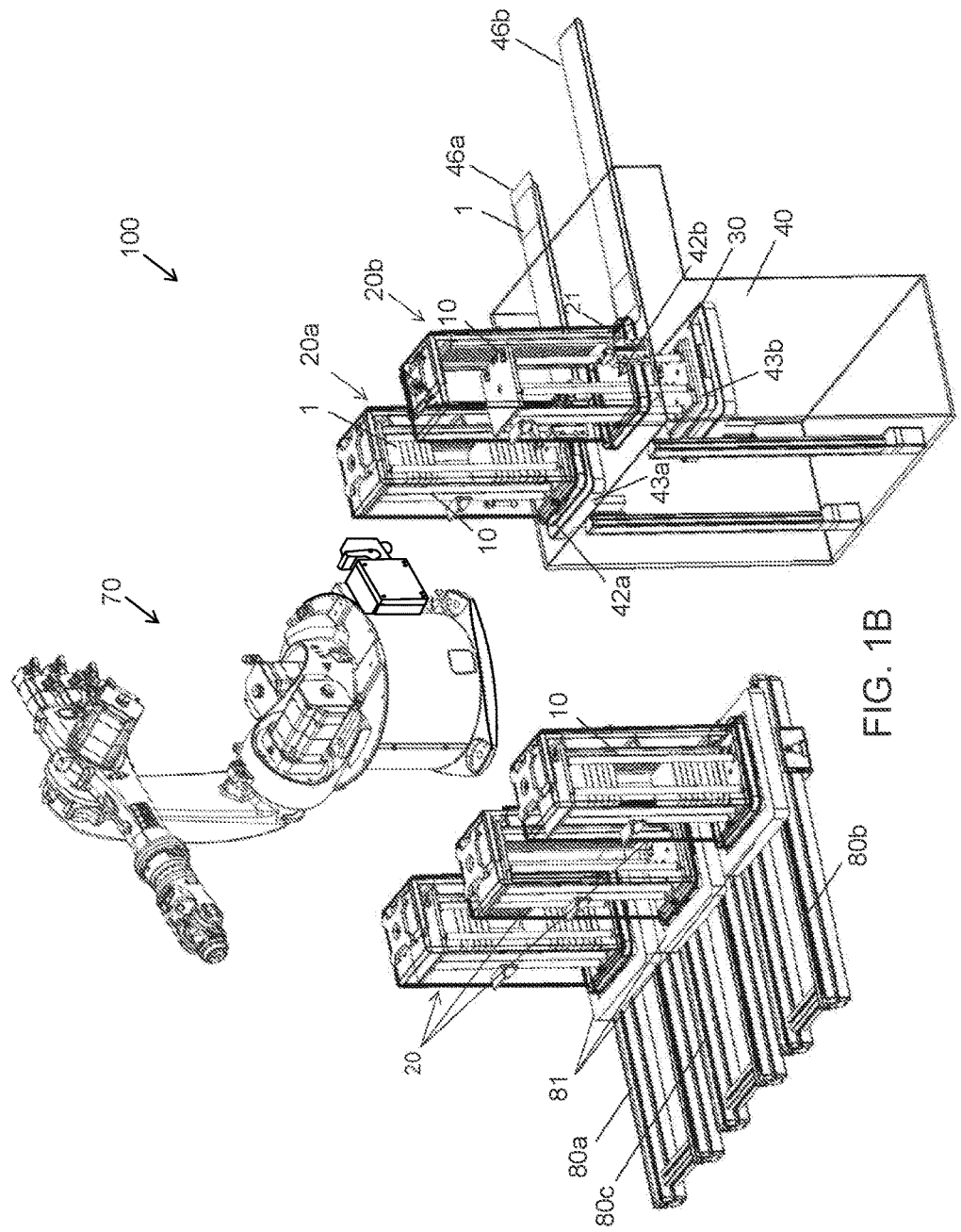
FIG. 1B illustrates the load lock system of FIG. 1A with the housings of the solar cell carrying pod and tank receptacle shown as transparent to better show internal components.

FIGS. 1A and 1B show an overview of an automated load lock solar cell transfer system 100. System 100 includes tank receptacle 40 having incoming conveyor 46a and outgoing conveyor 46b for conveying solar cells between a process flow tube 2 and one or more solar carrying pods 20 via the tank receptacle 40. Detail view of select portions of system 100 are shown in the subsequent figures. As can be seen in the detail view of FIG. 3A, each of solar cell carrying pod 20 includes a cover 21 and a removable base 30 attached to a cassette 10 adapted to hold a stack of solar cells or solar cell components. Cassette 10 can be withdrawn into an interior of tank receptacle 40 through a respective port 42 by elevator platform 43 on which solar cell carrying pod base 30 is coupled to facilitate loading and unloading of the respective cartridge. Each solar cell carrying pods 20 maintains a micro-environment of inert gas (e.g. Nitrogen) to maintain the integrity of any solar cell components stored within. Since cassette 10 occupies a substantial majority of the internal cavity of solar cell carrying pod 20, the amount of the inert gas required to establish the microenvironment is minimized. Each solar cell carrying pod 20 can be disassembled, such as through a removable door, by a mechanism of tank receptacle that withdraws cassette 10 into tank receptacle 40 while maintaining a sealed microenvironment. Typically, one or more lip seals circumscribe ports 42 in tank receptacle 40 so as to sealingly engage with the bottom of cover 21 to maintain the microenvironment and minimize any loss of the inert gas. Typically, the seals are adapted to seal sufficiently tight to support a slight positive pressure so that the microenvironment can be more easily maintained and avoid any intrusion of ambient air.

In various embodiments, system 100 includes a control unit that coordinates movement of the conveyors—both conveying movement and extending movement of the conveyors toward cassettes 10 withdrawn into the interior of tank receptacle 40. This process allows for loading of one or more solar cells from a conveyor to a cassette and/or unloading of one or more solar cells from cassette 10 onto a conveyor by coordinated movement between elevators and conveyors. In the embodiment shown here, tank receptacle 40 includes a pair of ports to which a pair of solar cell carrying pods 20a, 20b, incoming port 42a for unloading incoming solar cells and outgoing port 42b for loading outgoing solar cells, as shown in FIG. 1B.

Figure 3A:
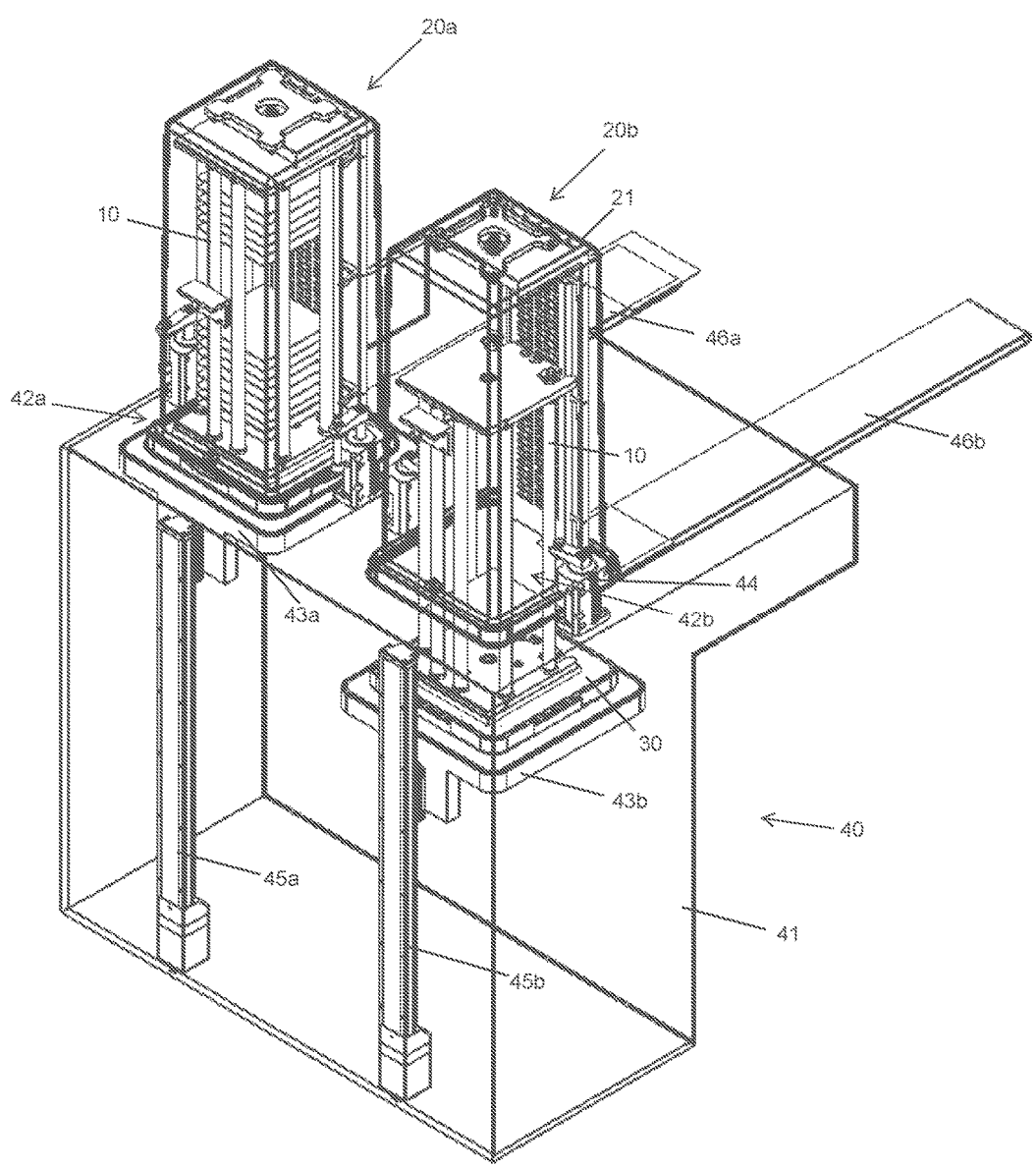
FIGS. 3A-3B illustrate various views of the tank receptacle and attached solar cell carrying pods of FIG. 2A with the housings of the tank receptacle and solar cell carrying pods shown as transparent to better show internal components.
Figure 3B:
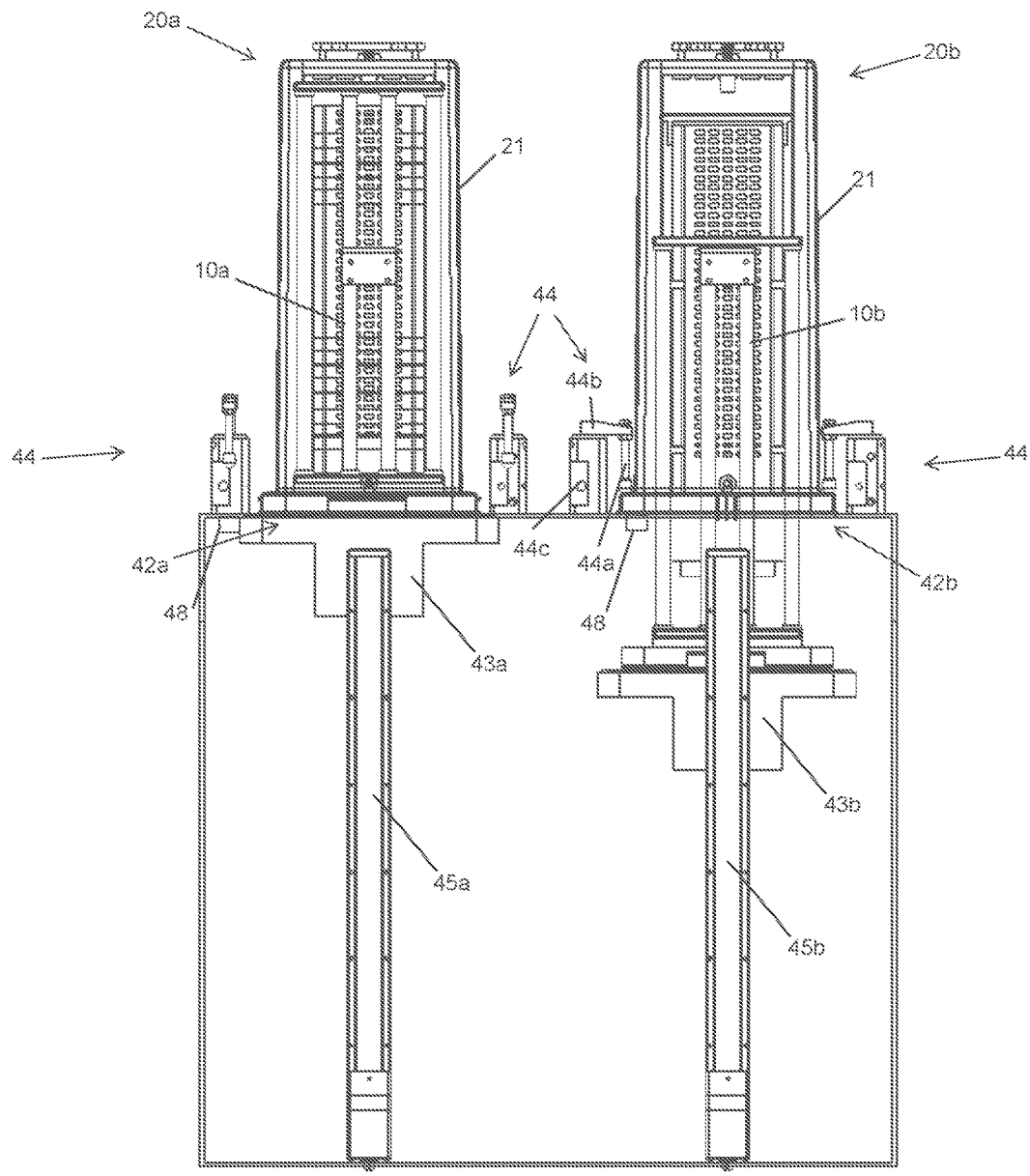

As shown in FIGS. 1B and 3B, solar cell carrying pod 20a contains cassette 10, which is loaded with incoming solar cells. Solar cell carrying pod 20a is then mounted to the incoming port for unloading of solar cells onto incoming conveyor 46a for conveyance into the process flow within the tube attached to tank receptacle 40. Solar cell carrying pod 20b is mounted on the outgoing port of tank receptacle 40 and its cassette 10 is withdrawn into tank receptacle 40 to facilitate loading of outgoing solar cells into cassette 10 by coordinated movement of respective elevator platform 43b and outgoing conveyor 46b.

Figure 1C:
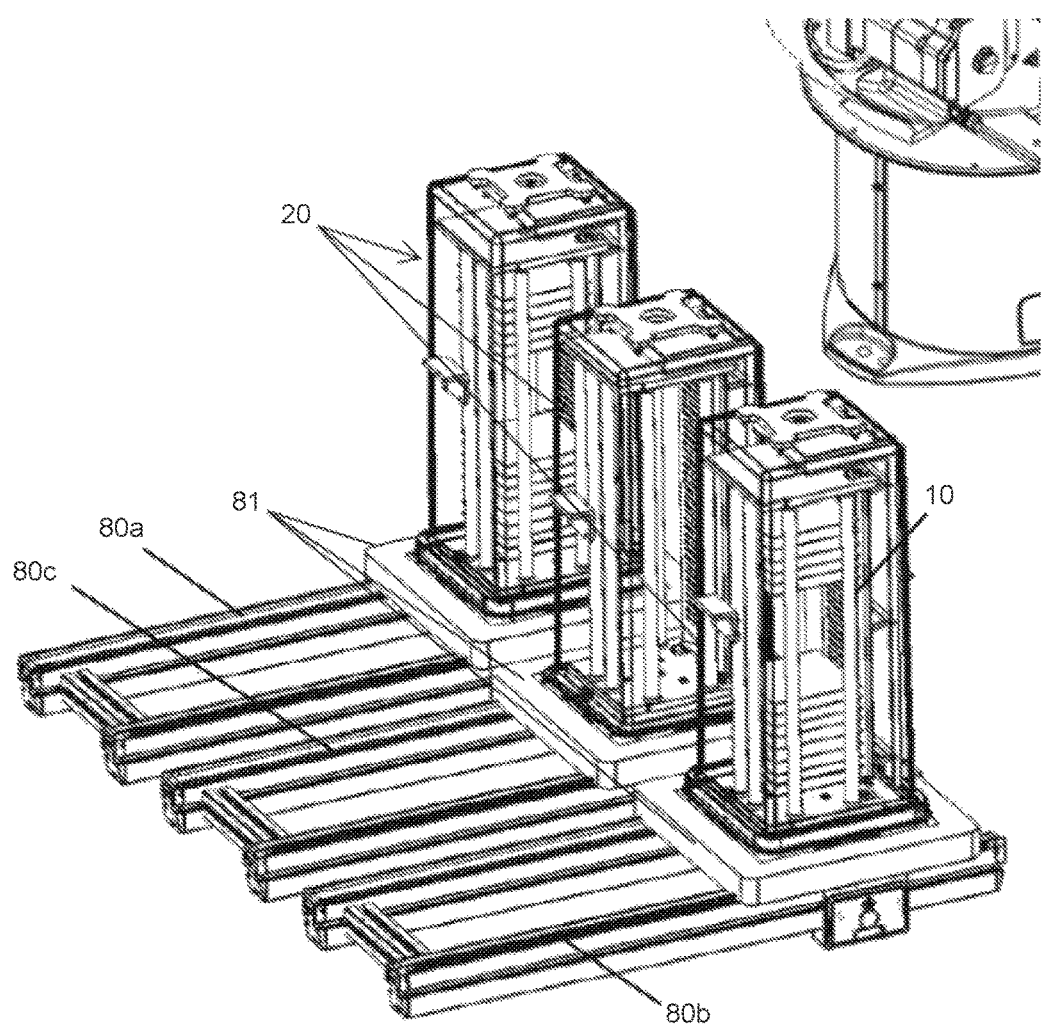
FIG. 1C illustrates a detail view of the staging racks shown in the load lock system of FIG. 1A.

Staging tracks 80a, 80b, 80c, shown at left in FIGS. 1A-1B and shown in detail in FIG. 1C, are used for staging of the solar cell carrying pods to facilitate large-scale loading and unloading of outgoing and incoming solar cells from multiple solar cell carrying pods by use of an automated robotic arm 80 to facilitate repeated cycling of full and empty solar cell carrying pods. Solar cell carrying pods 20 may be supported on pallets 81 having a recess or molded portion for supporting a pod base in a particular position and/or orientation. Pallet 81 can be formed with a similar recess or molded feature as that shown on the elevator platforms 43 so as to fittingly receive an underside of each of solar cell carrying pods 20. Each of staging racks 80 can be configured so that pallets 81 readily slide, or are automatically conveyed to a particular position so that the robotic arm can process multiple solar cell carrying pods for loading and/or unloading by repeating a pick-up or drop-off operation at the same position along the respective staging track.

Each staging rack may be designated for a particular purpose so as to be amenable to automation for large-scale solar cell transfer. In this embodiment, staging track 80a carries one or more solar cell carryings pods 20 with cassettes loaded with incoming solar cells so that each pod can be picked-up, in turn, by robotic arm and attached to the incoming port 42a of receptacle tank 40 for unloading of incoming solar cells. After unloading, the empty cassette 10 can be raised into the respective solar cell carrying pod and sealed, after which the empty pod can be placed by the robotic arm onto staging track 80c. Any empty solar cell carrying pods on staging track 80c can be picked-up by robotic arm 70 and positioned onto and attached to outgoing port 42b on receptacle tank 40 for loading of outgoing solar cells. After outgoing solar cells received from the process flow tube are conveyed and loaded into the cassette 10 of solar cell carrying pod 20b, the full or partially full cassette 10 is raised into the pod by elevator 43b and sealed, then placed by robotic arm 70 onto staging track 80b.

Full or empty pods can be removed from or placed on any of staging tracks, as needed, for storage or transfer of incoming or outgoing solar cells, either manually or by various other automated processes. The above described process is advantageous as it allows for repeated transfer of incoming solar cells and outgoing solar cells between numerous solar cell carrying pods and the process flow tube as needed for large scale solar cell fabrication. While dedicated incoming and outgoing ports and conveyers are utilized here to facilitate large scale transfers of solar cells. It is appreciated, however, that these concepts can be used alternatively to facilitate loading and unloading of outgoing and incoming solar cells with a single port.

Figure 2A:
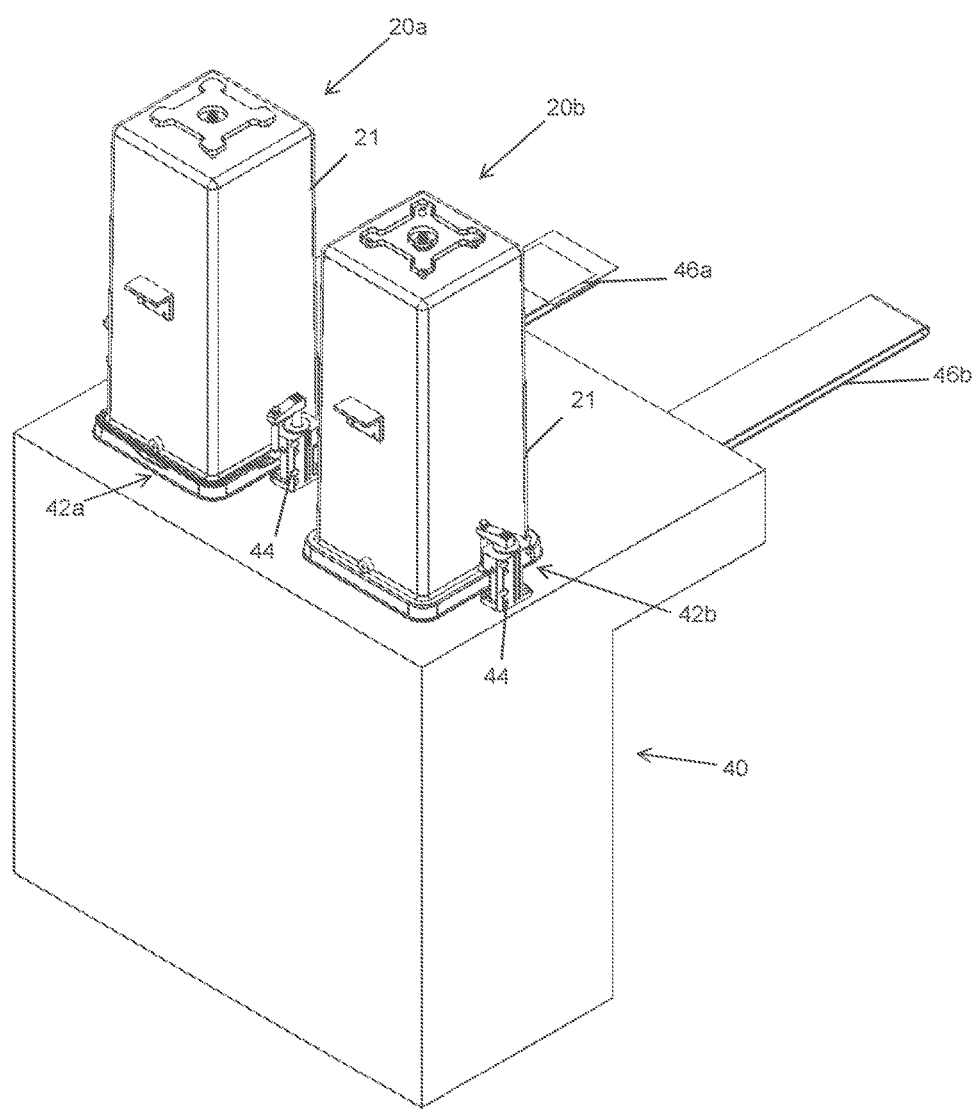
FIGS. 2A-2D illustrate various views of a tank receptacle attached to both an incoming solar cell carrying pod and an outgoing solar cell carrying pod to facilitate transport of solar cells from the processing tube via incoming and outgoing conveyers in accordance with various exemplary embodiments of the invention.
Figure 2B:
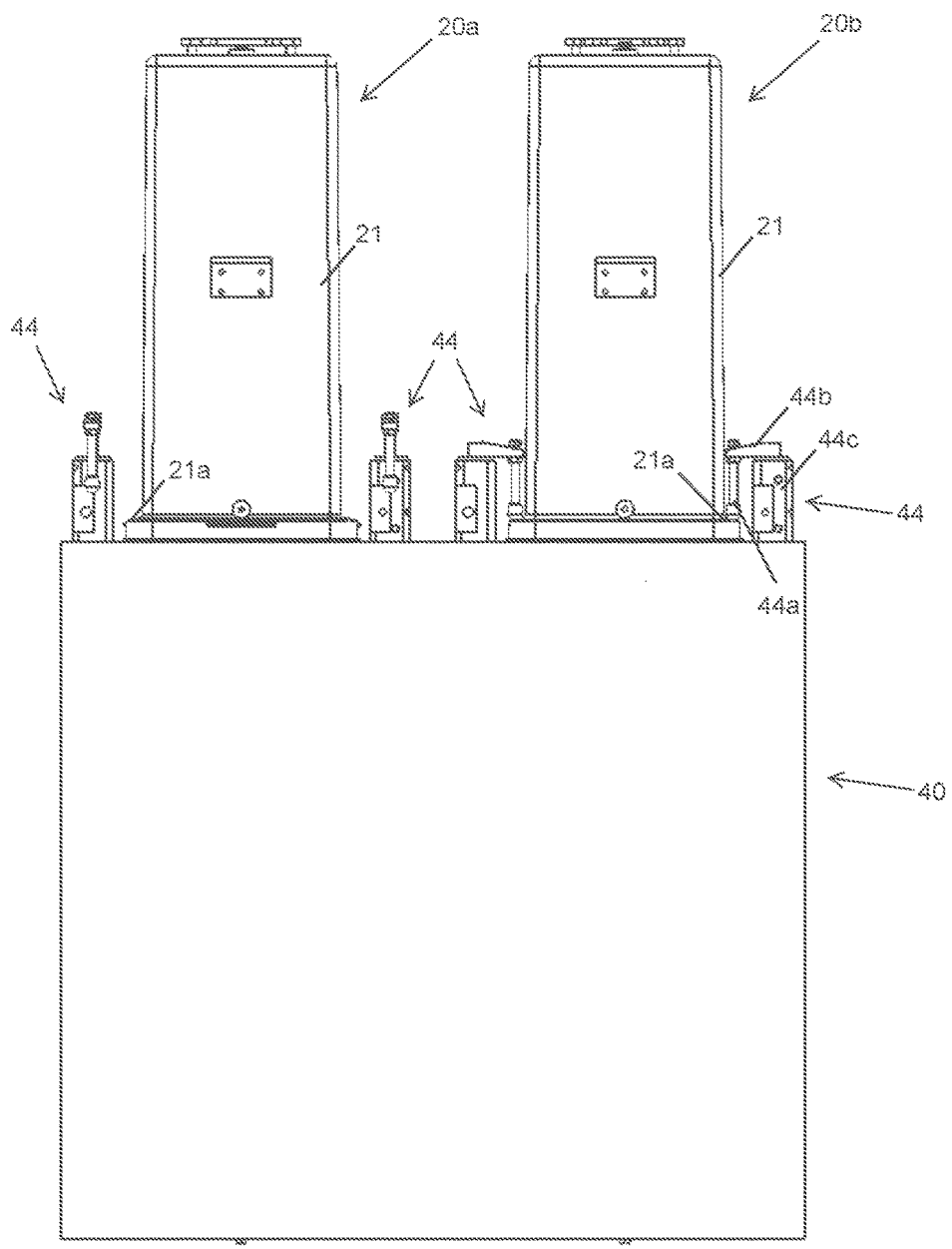
Figure 2C:
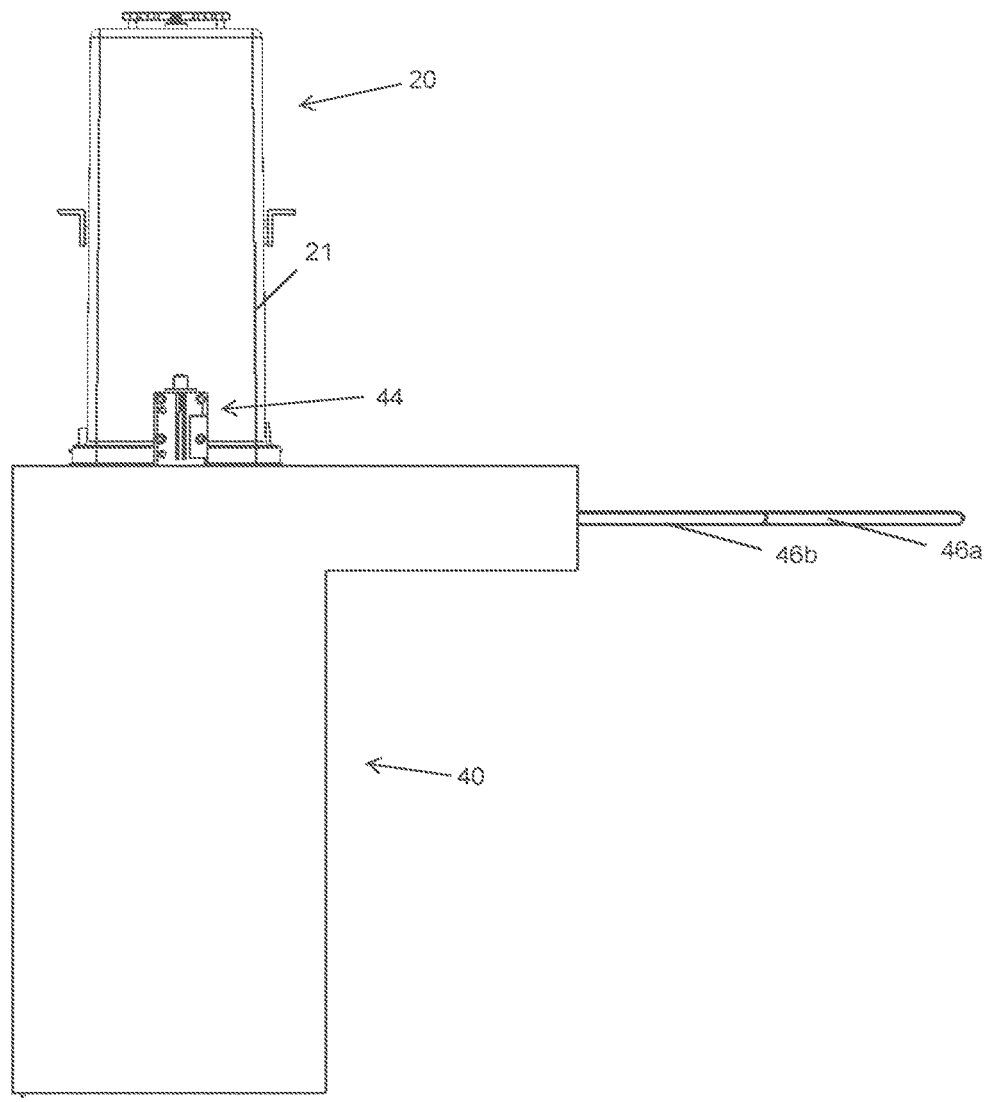
Figure 2D:
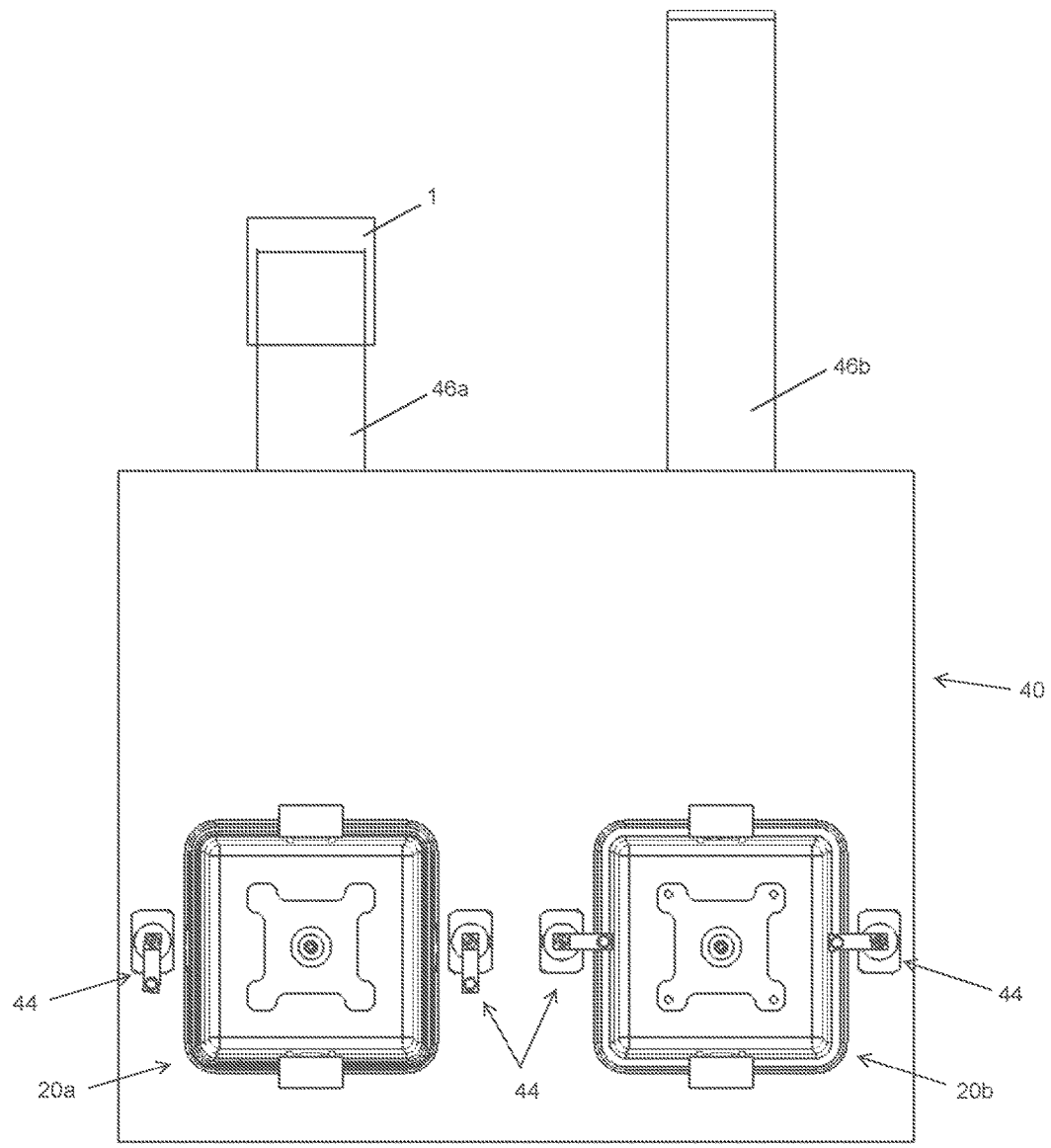

As shown in FIGS. 2A-D and 3A-3B, tank receptacle 40 includes a pair of clamping mechanisms 44 on each side of the incoming and outgoing ports by which each respective solar cell carrying pod 20 is sealingly coupled to respective port. The system can include one or more sensors (not shown), such as a pressure sensor, RFID detector, or proximity sensor, to determine when the solar cell carrying pod is properly positioned over a respective port 42. FIG. 2B shows a front view of tank 44 with clamping mechanisms 44 adjacent each port, before clamping mechanisms 44 adjacent solar cell carrying pod 20a are rotated to seal cover 21 to tank receptacle 44 and after clamping mechanisms 44 adjacent solar cell carrying pod 20b are rotated into place sealingly coupling cover 21 to tank receptacle. This same configuration is show in the side view of FIG. 2C and the overhead view in FIG. 2C.

Figure 4A:
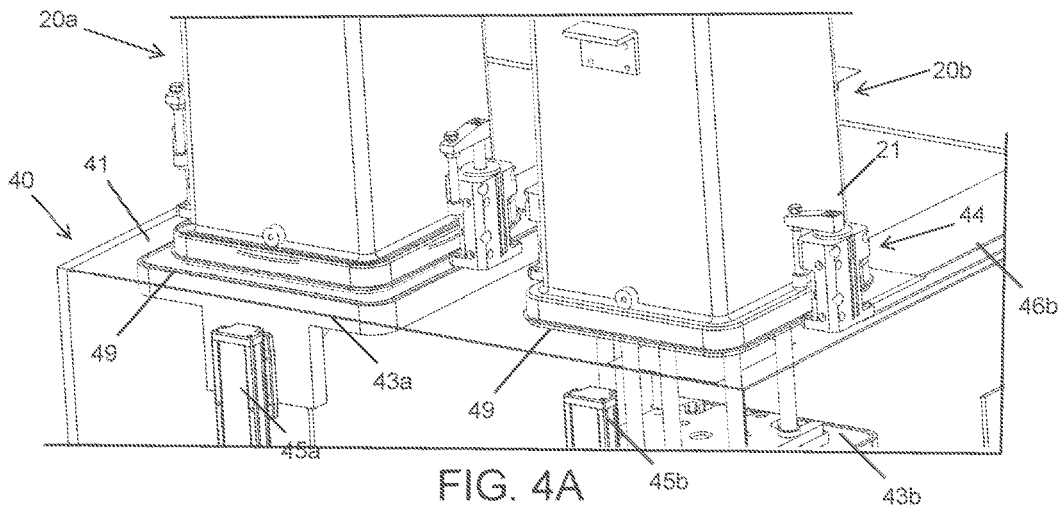
FIGS. 4A-4B illustrate detail views of a clamping mechanism to facilitate sealing attachment of the pod covers of the solar cell carrying pods with each of the incoming and outgoing ports on the receptacle housing to facilitate loading and unloading of solar cells in accordance with various embodiments.
Figure 4B:
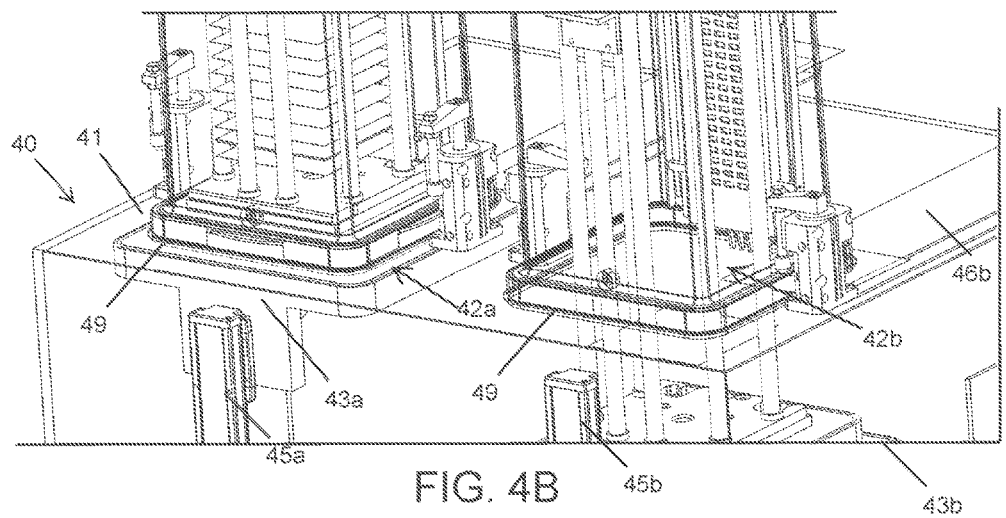

FIGS. 3A-3B show a perspective view and a front view of the same configuration in FIG. 2A with the housings of tank receptacle 40 and each solar cell carrying pod cover 21 shown as transparent to better illustrate the internal components. FIGS. 3C and 3D show detail views of the clamping mechanism 44 in the open configuration and the clamped configuration, respectively. In the embodiments shown in FIG. 3B, each clamping mechanism 44 includes a finger 44a, extending from a pivoting arm 44b, that is rotated by a base 44c mounted on the top of receptacle tank 40. A distal tip of the finger 44a pressingly engages against an outer surface of an outer bottom edge of the solar cell carrying pod cover so as to provide sufficient force to sealingly engage a bottom edge of the solar cell carrying pod cover with the top surface of receptacle tank surrounding the port opening. As shown in FIG. 4B, a lip seal 49 circumscribe each port 42 so as to provide an air-tight seal between cover 21 and the housing 41 of tank receptacle 40, even under a positive pressure within the receptacle tank and pod. In this embodiment, the bottom edge of the pod cover includes a sloped or ramped surface so that the distal end of the finger 44a of the sealing mechanism can be rotated laterally to engage the outer surface of the pod. The distal tip of the finger may be defined in a bulbous shape to facilitate sliding and/or engagement with the outer surface of the pod. The finger may also be provided with a tip formed of a softened material, such as rubber or silicone, to further facilitate sliding and engagement with the pod.

Figure 4C:
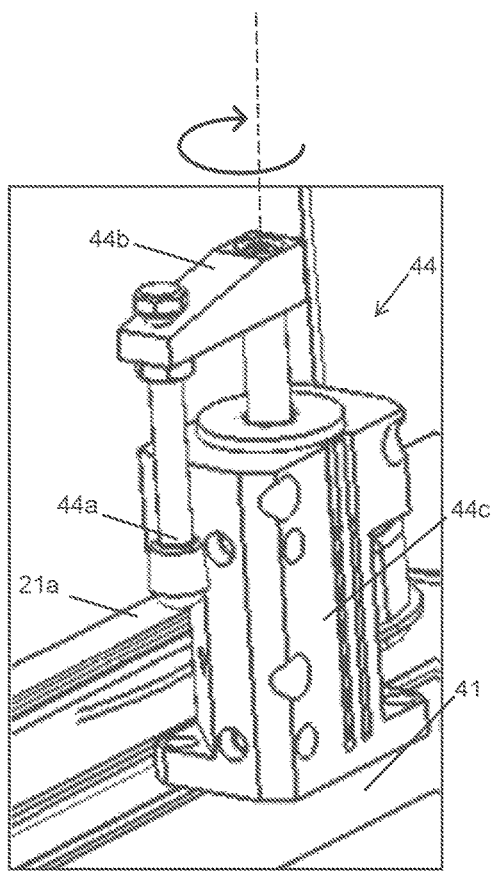
FIGS. 4C and 4D illustrate the clamping mechanism in FIGS. 4A-4B in the open and clamped configurations, respectively, in accordance with various embodiments.
Figure 4D:
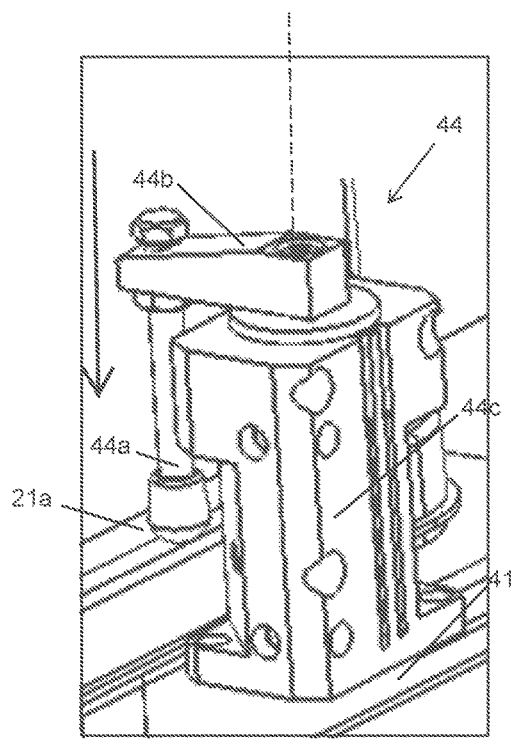

FIGS. 4C and 4D show detailed views of clamping mechanism 44 in the open and clamped configurations, respectively. As can be seen in FIG. 4C, in the unclamped position, the pressing finger 44a extends distally from movable arm 44b and is spaced away from pod cover bottom edge 21a. Once the pod is properly positioned, clamping actuator base 44c effects the clamped position. In this embodiment, such an actuation include rotating arm 44b about its vertical axis and swings pressing finger 44a over pod cover bottom edge 21a, then lowers arm 44b vertically downwards so as to press finger 44a against pod cover bottom edge 21a sufficiently to sealingly couple pod cover 21 against tank receptacle housing 41.

In this embodiment, clamping mechanism 44c can include a motor driven actuator, such as a rotary actuator or linear actuator (e.g. servo motor), to effect pivoting movement of arm 44b so as to pressingly engage the finger 44a against the ridge 21a of cover 21, as can be seen in FIG. 2B. The motor may be coupled with a controller that pivots finger 44a towards pod 20 in response to an output from a sensor (e.g. pressure, RFID detection) that indicates the presence of the pod placed over port. While the clamping mechanisms in this embodiment utilize a downward facing finger that swings laterally into place, it is appreciated that the clamping mechanism can be configured to raise and lower sealing finger 44a or to utilize various other sealing mechanisms may be used to apply a downwardly directed force against the pod cover sufficient for sealing.

As shown in FIG. 43b, once the solar cell carrying pod cover is sealingly coupled to the receptacle tank 40 over a respective port, elevator platform 43b within tank receptacle 40 couples with base 30 of solar cell carrying pod 20b, effects detachment of base 30 from solar cell carrying pod cover 21. Elevator 43b then lowers along track 45b so as to withdraws pod base 30 along with the attached cassette 10 into tank receptacle 40 by moving elevator platform 43 downward along elevator track 45, as shown in FIG. 4A-4B. Once in a desired position, loading and unloading of solar cells or solar cell components within cassette 10 is facilitated by coordinated movement of the elevator platform and the conveyor along which the solar cell components are conveyed. An example of such coordinated movement used in loading outgoing solar cells is shown in FIGS. 5A-5D.

Figure 5A:
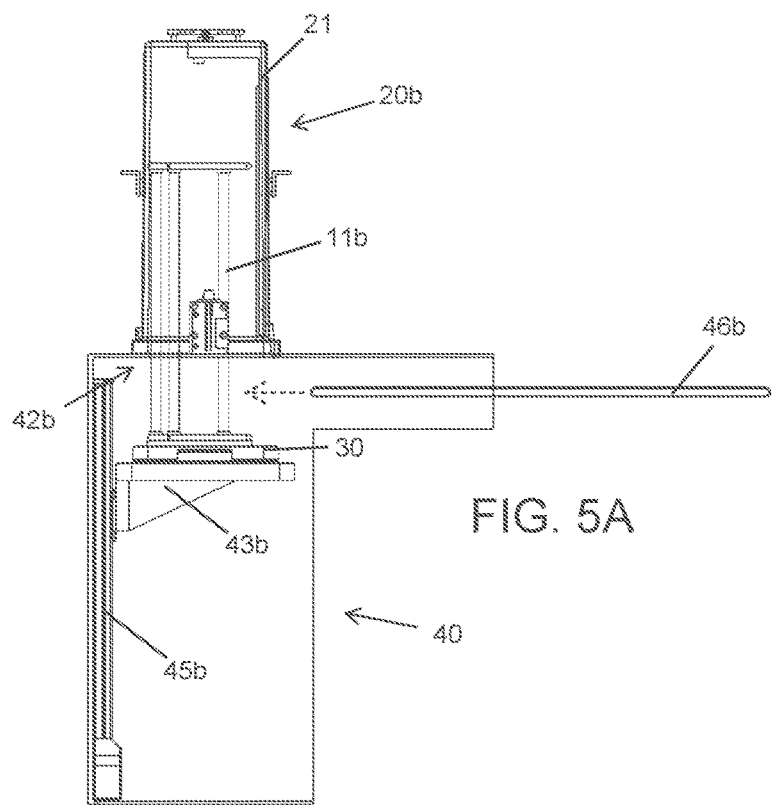
FIGS. 5A-5D illustrate sequential views of loading outgoing solar cells in a cassette of an attached solar cell carrying pod via coordinated movement of the elevator and an outgoing conveyor in accordance with various embodiments.
Figure 5B:
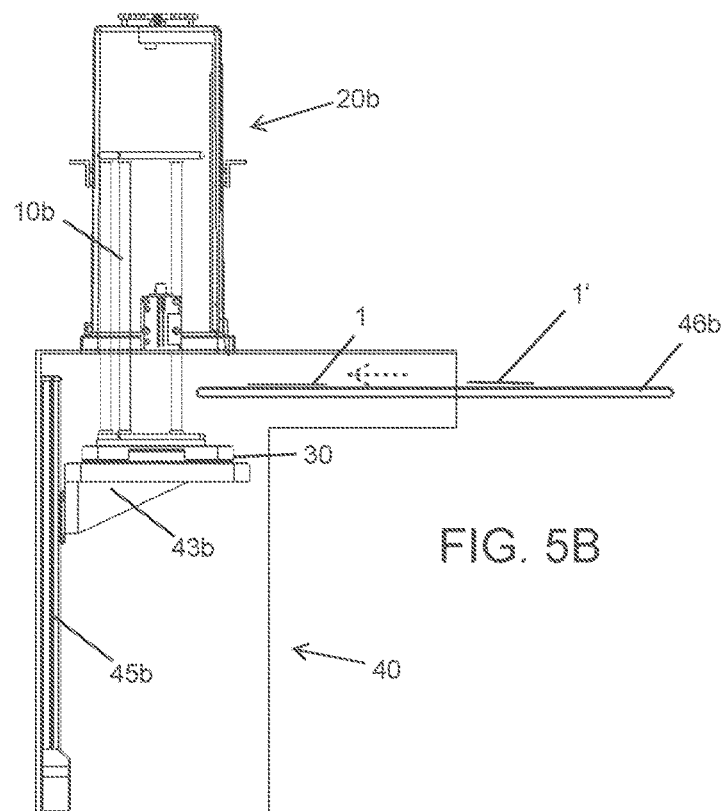
Figure 5C:
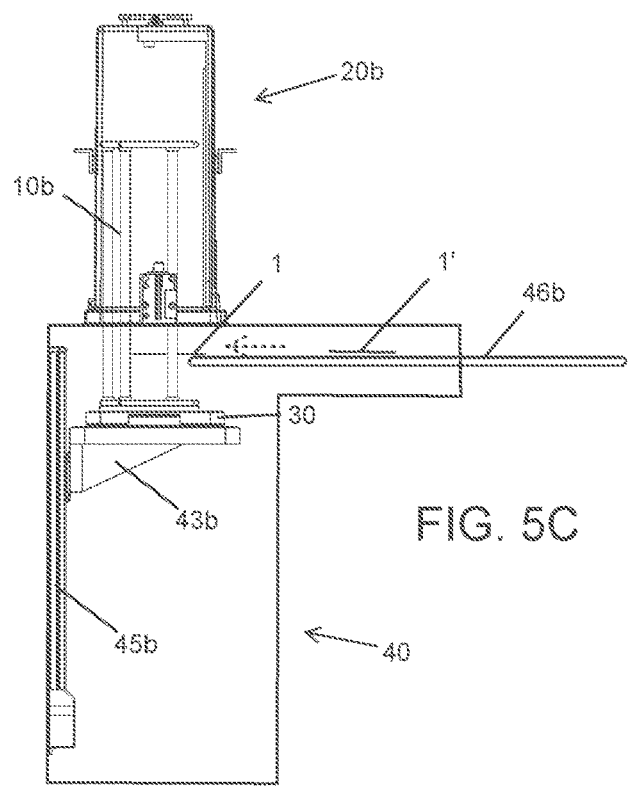
Figure 5D:
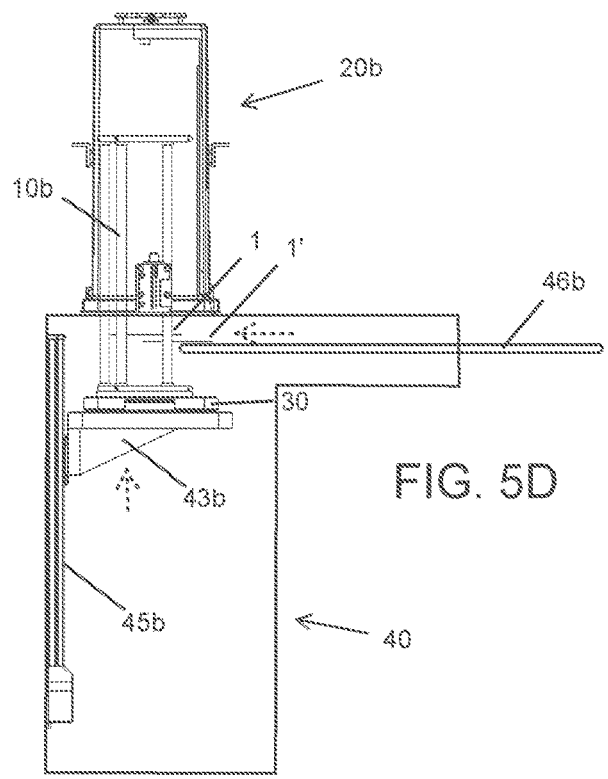
Figure 19A:
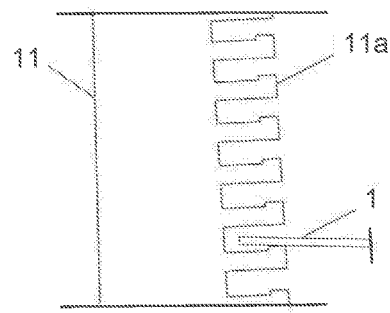
FIGS. 19A-19C illustrate solar cell carrying features defined in the rods of exemplary solar cell carrying cassettes for use in a solar cell carrying pod and transfer system in accordance with various embodiments.
Figure 19B:
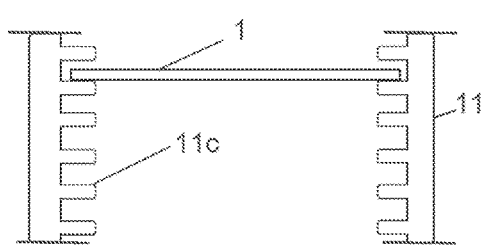
Figure 19C:
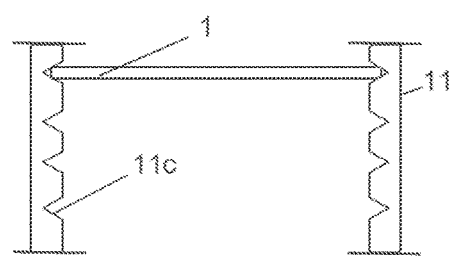

In FIG. 5A, solar cell carrying pod 20b including an empty cassette 10 for loading of outgoing solar cells has been sealed over the outgoing port 42b of tank receptacle 40 and pod base 30 has been coupled to elevator platform 43b, detached from cover 21 and withdrawn so that cassette 10 is partly within the interior of tank receptacle 40. Solar cells may be positioned along a number of different shelves defined by support features in the rods of the cassette 10 (see FIGS. 19A-19C). Typically, cassette 10 is lowered until the top surface of the conveyor is at about the level of the top-most shelf of the cassette 10 at which an outgoing solar cell can be loaded in order to allow cassette 10 to be complete filled. It is appreciated however, that cassette 10 could be lowered to various positions in order to access various differing levels or shelves or to only partly fill the cassette 10 if desired. Once cassette 10 is lowered into a suitable position for loading of outgoing solar cells therein, as shown in FIG. 5A, the outgoing conveyor 46b is translated laterally towards cassette 10. The conveyor may be translated to a position near the edge of the front opening defined by the rods of the cassette 10, as shown in FIG. 5B, or until the distal edge of the conveyor is within an interior space of the cassette 10. Once positioned as desired, outgoing solar cells are conveyed along outgoing conveyor 46b until the distal most solar cell 1 reaches its destination within a respective shelf of cassette 10, as shown in FIG. 5C. When loading solar cells, once a solar cell has been conveyed and slid into a storage shelf position defined between rods of cassette 10 the elevator platform 43b raises cassette 10 upwards so that a subsequent solar cell 1' on the conveyor can be slid into the next lower shelf position in cassette 10, as shown in FIG. 5D. This sequence of coordinated movement can be repeated until the cassette is filled with solar cells.

The process of unloading a filled cassette 10 from solar cell carrying pod 20a filled with incoming solar cells may be accomplished by merely performing the above described steps in reverse, that is unloading from the bottom up. In such a process, a solar cell within cassette 10 of pod 20a is engaged by incoming conveyor 46a until the solar cell is slid out of its position within cassette 10 and then conveyed on the incoming conveyor towards the process flow tube. The elevator platform 43a then moves downward until a bottom of the next solar cell upwardly adjacent solar cell is lowered to a level of the incoming conveyer for removal and transfer into the process flow tube via the conveyor. This approach of utilizing coordinated movement of conveyors and elevator platforms is advantageous as it allows for loading and unloading of the solar cell components along a common plane, which may be the same as the plane of solar cells being transported within the process flow tube. Thus, the transfer system can be incorporated into an assembly-line type process flow such that the solar cell can remain at about the same elevation when not stored within the cassette of a respective solar cell carrying pod.

In another aspect, transfer of solar cell carrying pods 20 between staging racks 80 and the incoming and outgoing ports of tank receptacle can be performed automatically by a robotic arm 70, as shown in FIG. 1A, which allows the above described process of unloading and loading to be performed repeatedly using a large number of solar cell carrying pods. To allow for transport of a respective pod by robotic arm 70, each solar cell carrying pod 20 includes a top handle 22 adapted for use with a gripper 60 on a distal end of robotic arm 71. Gripper 60 is adapted to releasably couple with top handle 22 of a respective solar cell carrying pod 20 for transport from staging racks 80 to a port 42 of receptacle 40, or vice versa.

Figure 6A:
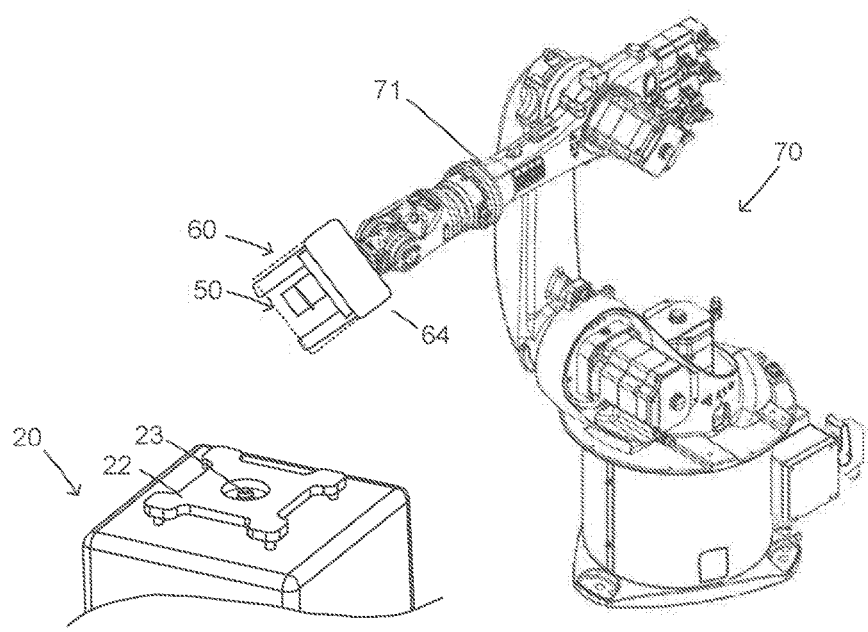
FIGS. 6A-6C illustrate a robotic arm of the system and associated gripper and nozzle mechanism for facilitating transport of the solar cell carrying pod and control of a microenvironment within each solar cell carrying pod via the nozzle in accordance with various embodiments.
Figure 6B:
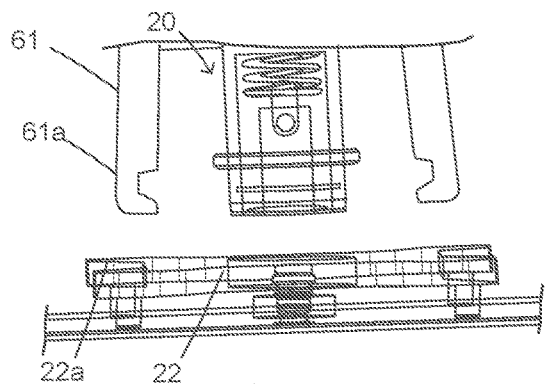
Figure 6C:
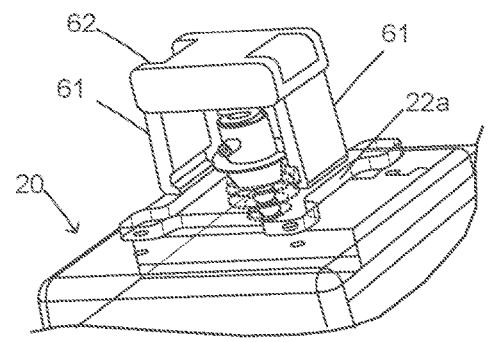

As shown in FIG. 6A-6C, gripper 60 is defined by a pair of movable grasping jaws 61 extending from a common base 62 attached to the robotic arm 71 and top handle 22 is defined by a plate securely coupled to and spaced away from the top surface of the pod cover to allow the handle 22 to be grasped by a pair of movable grasping jaws 61 of gripper 60. Grasping jaws 61 are moveable between an open position for receiving top handle and a closed position for grasping top handle between gripper jaws 61. Movement of grasping jaws 61 between open and closed positions is effected by an actuation mechanism.

In this embodiment, the gripper actuation mechanism includes sleeve 64 that is movable distally so as to force gripper jaws 61 towards one another after top handle 22 is positioned therebetween. In this embodiment, as shown in FIG. 8A, gripper jaws 61 are coupled with gripper base 62 at a pivotal coupling 62a and are biased laterally outward from one another with a biasing mechanism and are forced together by distal movement of sleeve 64 shown in FIG. 7B. Distal movement of sleeve 64 can be air-actuation by a pneumatic mechanism. The biasing mechanism can be a pair of springs 63, as shown in FIG. 8C, that are disposed within pivotal coupling 62a. While an air-actuated gripper actuation mechanism is described here, it is appreciated that the gripper may utilize any suitable mechanism for effecting movement of a gripper jaws between an open and closed position, for example, a cable driven or lead screw driven mechanism, or an actuatable magnet. In one such example, an electro-magnet may be positioned to close gripper jaws 61 by magnetic force when activated, such that gripper jaws can be readily moved between open and closed positions by selective activation of the magnet.

Figure 7A:
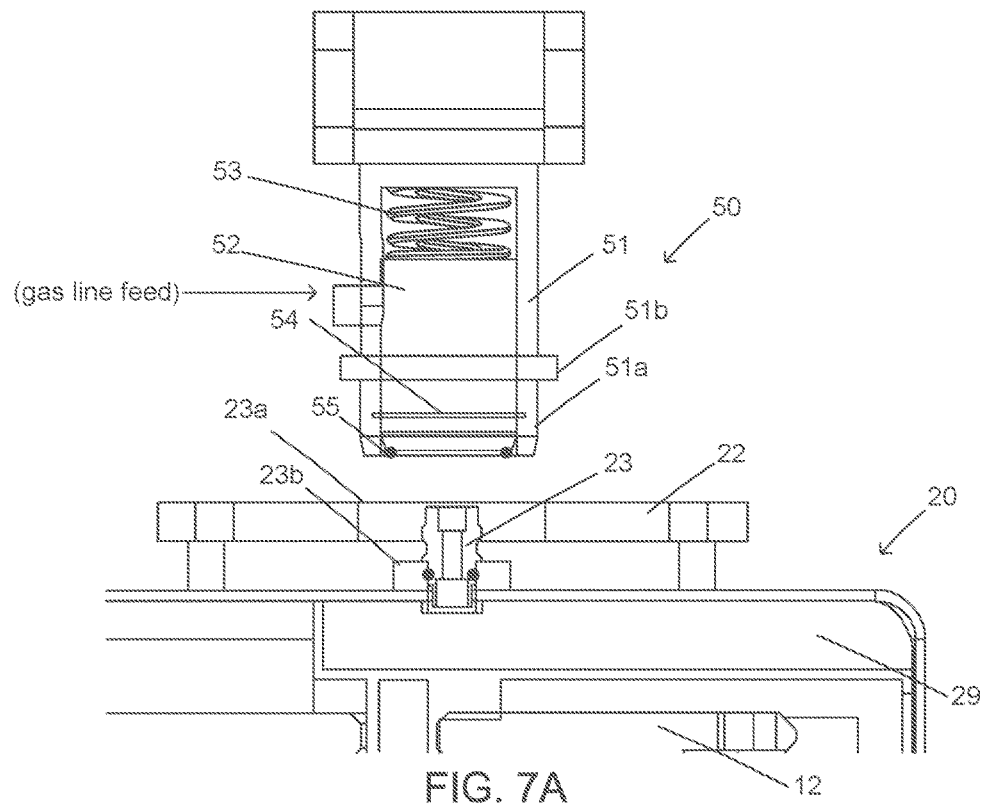
FIGS. 7A-7B illustrate a detail view of a gripper and nozzle device of the robotic arm before and after attachment to the top handle and pressure valve of the solar cell carrying pod, respectively, in accordance with various embodiments.
Figure 7B:
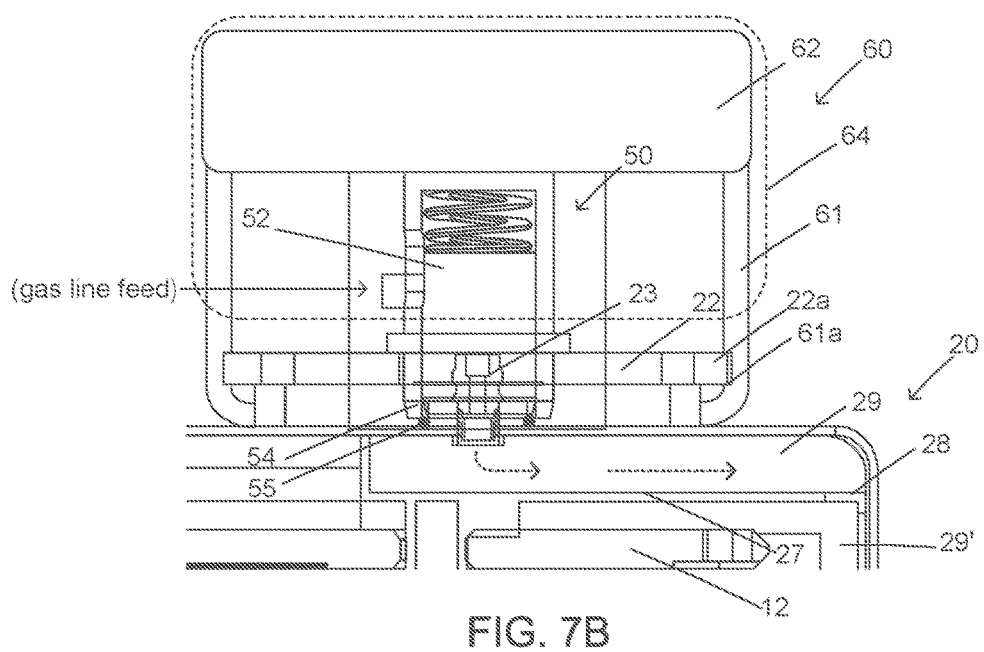
Figure 8D:
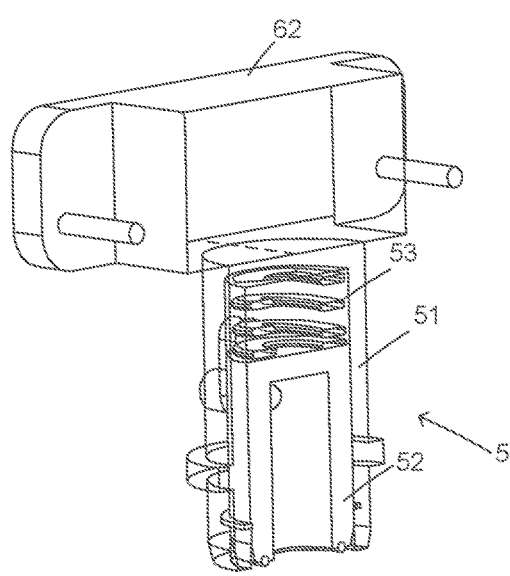
Figure 8E:
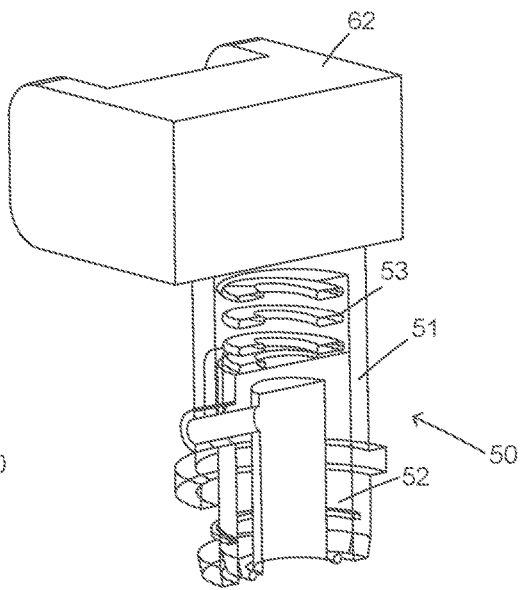
Figure 9A:
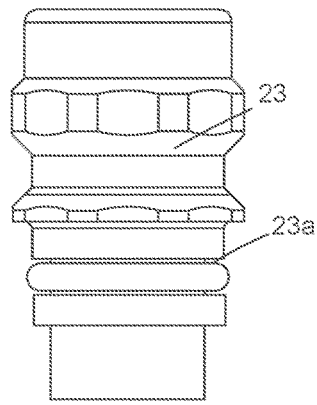
FIGS. 9A-9B illustrate various views of a valve of the solar cell carrying pod in accordance with various embodiments.
Figure 9B:
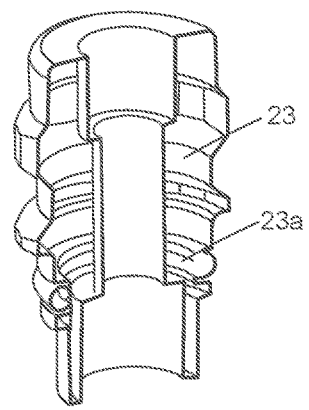

In another aspect, a nozzle assembly 50 is provided to allow for automated charging of a solar cell carrying pod with inert gas, such as Nitrogen. In this embodiment, the nozzle assembly is incorporated into gripper such that the solar cell carrying pod can be charged with the nozzle assembly while being transported with gripper 60. Nozzle assembly 50 includes a nozzle housing 51, nozzle 52, nozzle biasing member 53, a retention ring 54 and an O-ring seal 55, as shown in FIG. 7A. As the gripper is positioned over top handle 22, nozzle housing 51 extends through a center hole 23a in the plate of top handle 22 until a boss 51b abuts against the top surface of top handle 22. Nozzle housing 51 includes a tapered distal portion 51a to assist in directing nozzle housing through center hole 23a. Nozzle 52 slides over the valve boss 23b and O-ring 55 forms a seal about valve boss 23b so as to seal the interior flow path of nozzle 52 with valve 23, as shown in FIG. 7B. Nozzle biasing member 53, typically a spring, ensures there is sufficient force between nozzle 52 and valve 23 to support a positive pressure of inert gas sufficient to charge the environment of the solar cell carrying pod. The various components of the nozzle assembly in relation to the gripper base and gripper jaws can be further understood by referring to the additional detail views shown in FIGS. 8A-8E.

In various embodiments, nozzle assembly 50 can include a sensor adjacent biasing member 53 for determining when valve 52 is properly seated on valve boss 23b with sufficient sealing pressure before activated pressure controlled gas flow through the nozzle, typically by opening a valve within the gas feed line upstream of the nozzle. In this embodiment, valve 23 is a Schrader type valve as depicted in FIGS.

9A-9B (shown without pin). It is appreciated that other types of valve can be used in a solar cell carrying pod in various other embodiments.

Nozzle 52 includes an inlet stub 52a that extends from a side of nozzle and through a slot 51a which allows for movement of the inlet stub during back-and-forth movement of nozzle 52 during coupling with the valve. The inlet stub 52a is coupled with the inert gas feed line, which can be attached to robotic arm 70 so as to not to interfere with movement of the robotic arm. While this embodiment, includes the inlet stub 52a on the side of nozzle, it is appreciated that the inlet of nozzle 52 could be included in various other locations, including in the center of the top of the nozzle, which would avoid the need for slot 51a. Including inlet stub on the side is useful as this allows more clearance for various other components above the nozzle, such as components associated with the integrated gripper.

Figure 10A:
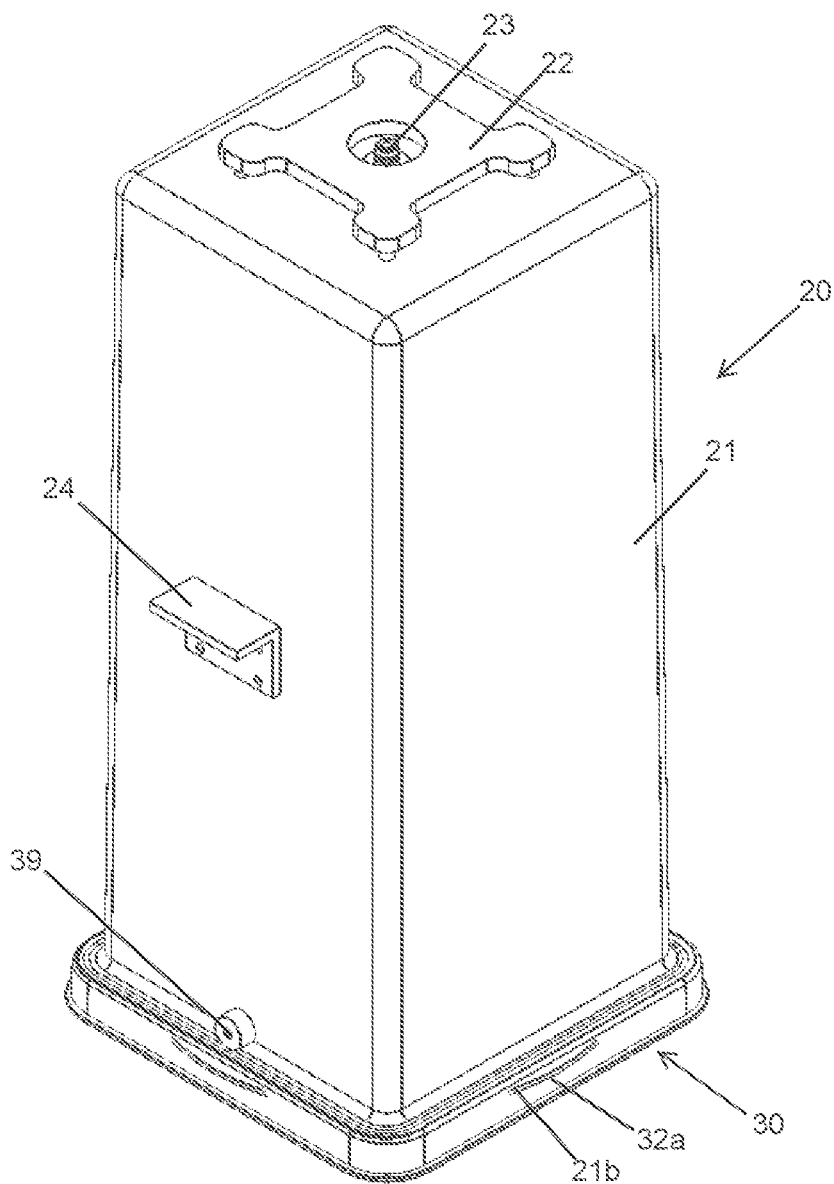
FIGS. 10A-10E illustrate various views of a solar cell carrying pod adapted to provide a microenvironment during transport and storage of solar cells carried within in accordance with various embodiments.

The above described configuration of nozzle assembly 50 is advantageous as it allows valve 23 to be sealingly coupled with the gas feed line for charging of the solar cell carrying pod, without requiring the higher tolerances that would be required if the nozzle were required to seal at the distal opening of the valve having a substantially smaller diameter. In addition, sealing the immediate environment about the valve by sealing the valve boss 23 with O-ring 55 allows a higher flow rate of gas such that an empty solar cell carrying pod can be charged with inert gas relatively quickly, for example, within a few seconds (e.g. less than 5 seconds, about 3 seconds or less). Once valve 23 is sealingly coupled with nozzle 52 and nozzle is pressurized with inert gas, gas flows into the sealed solar cell carrying pod. A secondary valve 39 may be included to allow purging of any ambient air within the empty solar cell carrying pod or bleeding of excess pressure within pod 20 and allow regular air within the pod to be blown out during charging. Typically, such a valve may be included at the bottom of the pod, as shown in FIG. 10A, since air flow is being introduced through valve 23 at the top of the pod. Inert gas can be introduced during charging at a positive pressure, for example 0-5 psi, typically about 1 psi. In the alternative, a partial vacuum can be drawn through valve 23 or secondary valve 39 before introduction of inert gas through valve 23.

In another aspect, each of grasping jaws 61 and top handle 22 can include corresponding features to facilitate interfacing between the components. In this embodiment, grasping jaws 61 include a recessed portion or groove 61a that receives an edge of top plate 22 within a recessed grasping region 22a dimensioned to correspond to the width of grasping jaw 61. These features allow each solar cell carrying pod 20 to reliably couple with gripper 60 of robotic arm 71 in a controlled and predictable position and/or orientation so as to facilitate controlled positioning of each respective solar cell carrying pod on a desired port of the receptacle tank 40.

In this embodiment, the nozzle and gripper are integrated such that engagement of gripper jaws 61 with the top handle 22 to facilitate transport of the solar cell carrying pod also substantially aligns the nozzle with the valve of the solar cell carrying pod. One or more additional features, such as a cut-out at the center of the top plate, can also be used to further facilitate alignment of the nozzle and valve. While this embodiment depicts a gripper integrated with a nozzle assembly 50 such that robotic arm 70 can effect controlled flow of gas into the solar cell carrying pod simultaneously or concurrently with grasping of the top handle with gripper 60, it is appreciated that the gripper and nozzle may be separate and/or controlled independent from one another. For example, in some embodiments, the nozzle may not be needed when the solar cell carrying pod has already been charged with inert gas previously. Thus, in such applications, a gripper without a nozzle may be used, or the nozzle may be de-activated or retracted so as not to engage the valve of the solar cell carrying pod.

Figure 10B:
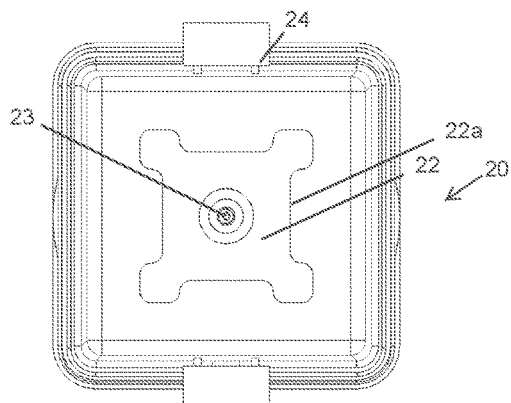
Figure 10D:
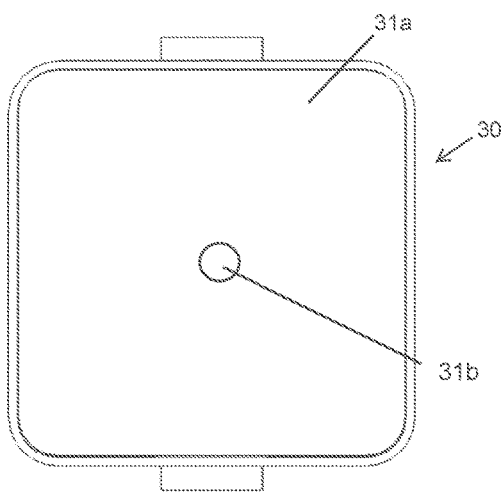
Figure 10C:
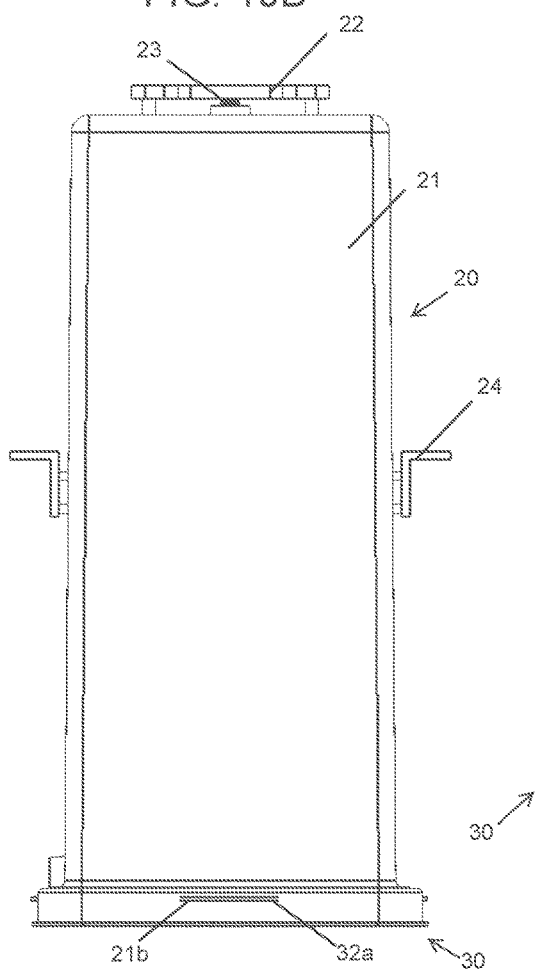

FIGS. 10A-10E show additional detail views of solar cell carrying pod 20 adapted for use with the load lock solar cell transfer system described above. FIG. 10A shows a perspective view of example solar cell carrying pod 20 having a cover 21 sealingly coupled with base 30 via locking ring blades 32a engaged with locking slots 21b in the bottom portion of cover 21. As shown, cover 21 includes top handle 22 with valve 23 for controlling the micro-environment inside pod 20 and a secondary valve 39 for purging pod 20 or for bleeding off excess pressure during charging. Cover 21 can further include side handles 24 to facilitate handling of sealed pod 20 during transport or storage. FIG. 10B shows a top view of pod 20 with top handle 22 having recessed grasping regions 22a on each side and valve 23 accessed through a central hole in top handle 22 and FIG. 10C shows a side view of sealed pod 20 of FIG. 10A.

Figure 10E:
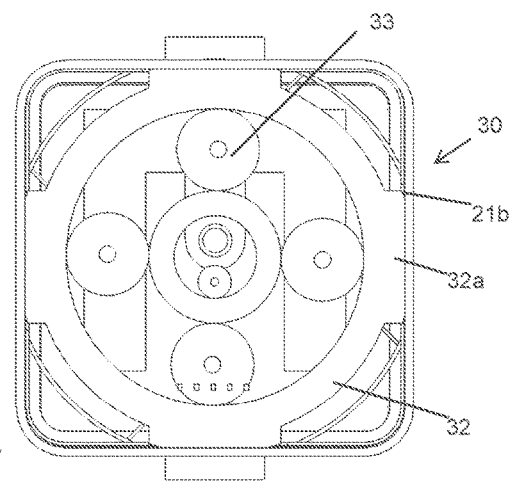

FIGS. 10D and 10E show a bottom view of sealed pod 20 of FIG. 10A with and without bottom cover 31a, respectively. Bottom cover 31a may fit over the bottom to protect the locking ring 32 and gear system 33 disposed in the underside that facilitates detachment and locking of the pod base 30 with the cover 21. Bottom cover 31a can include a central hole 31b to allow passage of an actuation mechanism that effects operation of locking/unlocking mechanisms within base 30. In various embodiments, the actuation mechanism is a collet that extends into base 30 through central hole 31b in bottom cover 31a such that bottom cover 31a can remain secured on base 30 during loading and unloading.

Figure 11A:
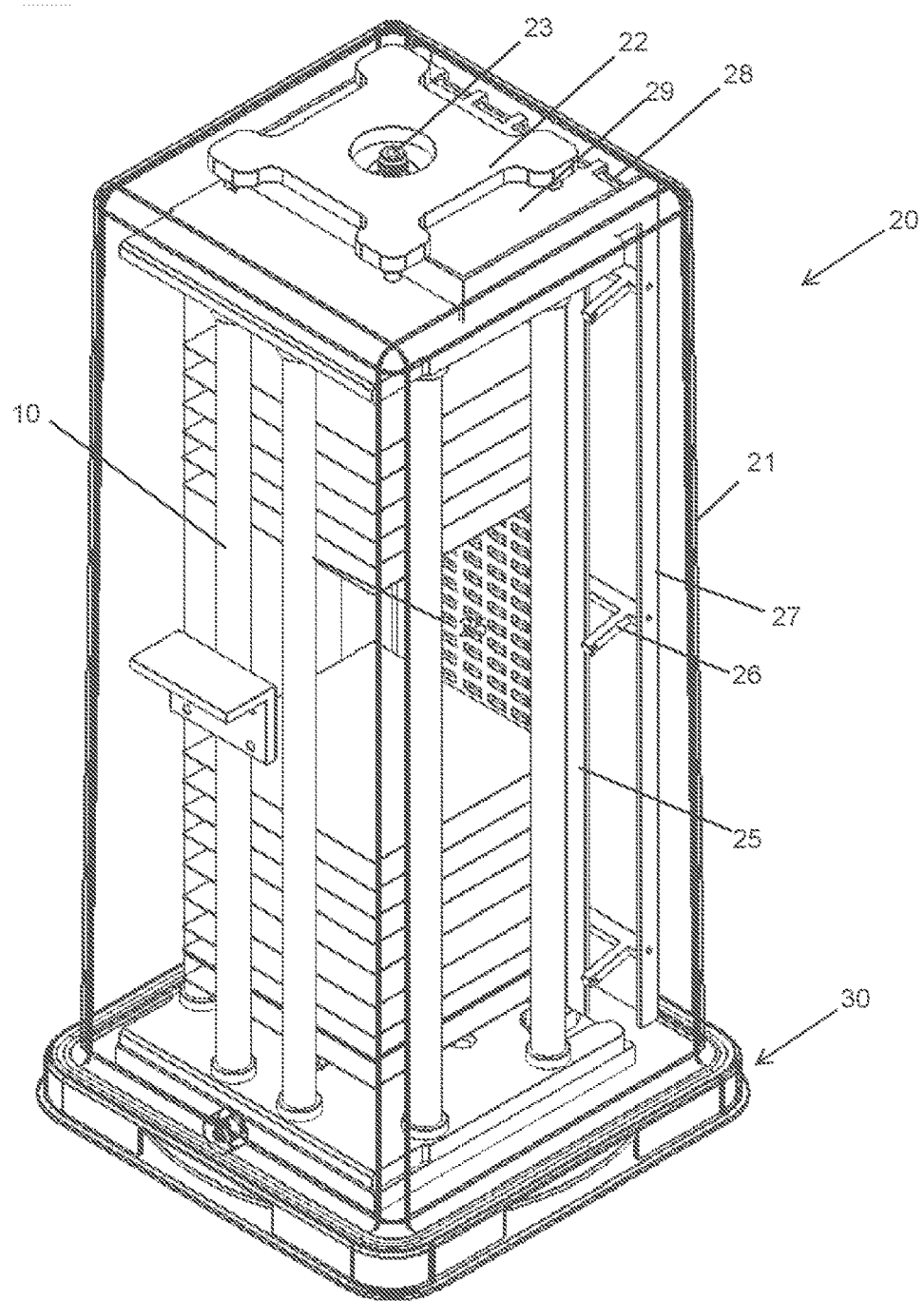

FIGS. 11A-11C illustrate align mount 27 and plenum diffuser 25 attached within cover 21 that together define a plenum and flow path through which the inert gas flows when charging the cassette through valve 23. Align mount 27 is positioned along a rear side of cover 21 and forms upper plenum 29 directly under valve 23 in which flow of inert gas accumulates before traveling through channels 28 and into the lower plenum defined between plenum diffuser 25 and align mount 27. Plenum diffuser includes an array of openings 25a along its major face to distribute air flow through the stack of solar cells 1 within cassette 10. Typically, pod 20 is charged with an inert gas provided through valve 23 at a pressure within a range of 0-5 psi, typically about 1 psi. This allows charging to be performed relatively quick, for example within 5 seconds or less, however, use of such pressures produces a relatively high flow rate that can potentially damage the delicate solar cell components stacked within the cassette, particularly if the gas flow is directed directly onto the upper-most wafer. To avoid this problem, upper plenum 29 allows gas to accumulate and redirect flow of gas into an elongate narrowed lower plenum for controlled distributed flow through plenum diffuser 25 and across the stack of solar cells.

In various embodiments, cassette 10 is defined by pairs of rods extending between end plates 12. Each end plate 12 includes coupling features 13 and alignment features 14 in end plates 12 of carrier cassette 10 are configured to interface with corresponding features inside solar cell carrier pod 20 to constrain movement of cassette 10 and secure cassette 10 within pod 20. For example, as can be seen in the cross-sectional view of FIG. 11B and the side view of FIG. 11C, upper plenum can include a stub 29a that extends through coupling feature 13 in the adjacent end plate 12 of cassette 10. This interface constrains lateral movement of adjacent end plate 12 of cassette 10 within both the x-direction and y-direction, while still allowing movement in the z-direction when cassette 10 is withdrawn by retracting base 30 into tank receptacle 40. In end-plate 12 coupled to base 30, alignment feature 14 (e.g. three holes spaced apart by 120 degrees) can interface with corresponding protrusions or pegs 30a extending from base. These alignment features maintain the x-y orientation and prevent movement in the x-direction and y-direction. When base 30 is securely coupled to cover 21, movement of cassette 10 in the z-direction is prevented by engagement of respective end plates 12 with each of upper plenum 29 and base 30.

In various embodiments, end plates 12 of cassette 10 can be further secured to base 30 with respect to the z-direction through coupling feature 13 when base 30 is removed from cover 21 and withdrawn into tank receptacle. This can be accomplished by collet 34, which is the same mechanism that effects unlocking and release of base 30 from cover 21, as described below with respect to FIG. 7C. Upon insertion into base 30, collet 34 extends through the gear drive system 33 and engages coupling feature 13 in end plate 12 in addition to collar 33a which drives the gear system 33. Since the distal-most portion of collet 34 expands to a greater diameter than a more proximal portion, cassette 10 is secured in the z-direction while collet 34 freely rotates in circular coupling feature 13 while engaged with gear system 33 so that cassette 10 is secured to base 30 in each of the x, y and z-directions while base 30 is retracted on elevator 43 into tank receptacle 44. This ensures precise positioning of solar cells carried within cassette 10 to facilitate automated loading and/or unloading of solar cells from cassette 10.

Figures 12A, 12B:
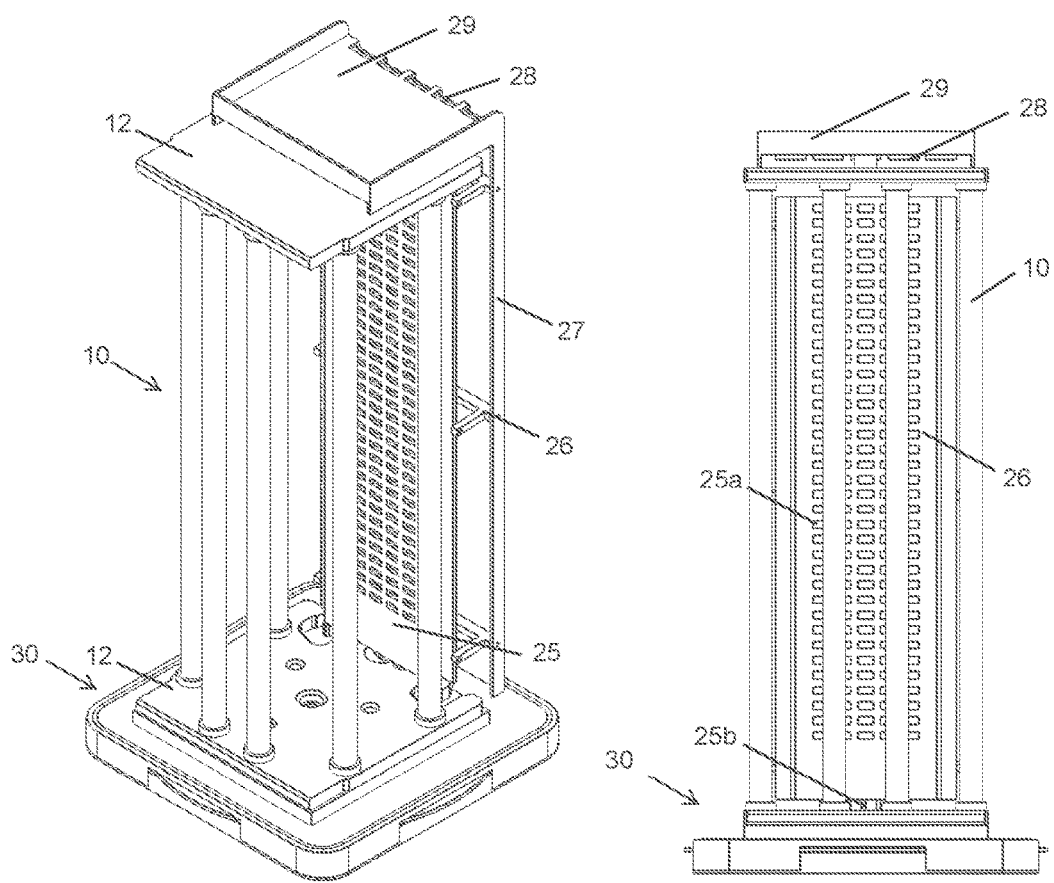
FIGS. 12A-12C illustrates various views of the align mount and plenum relative the cassette of FIG. 10A shown without the pod cover to better show internal components.
Figure 12C:
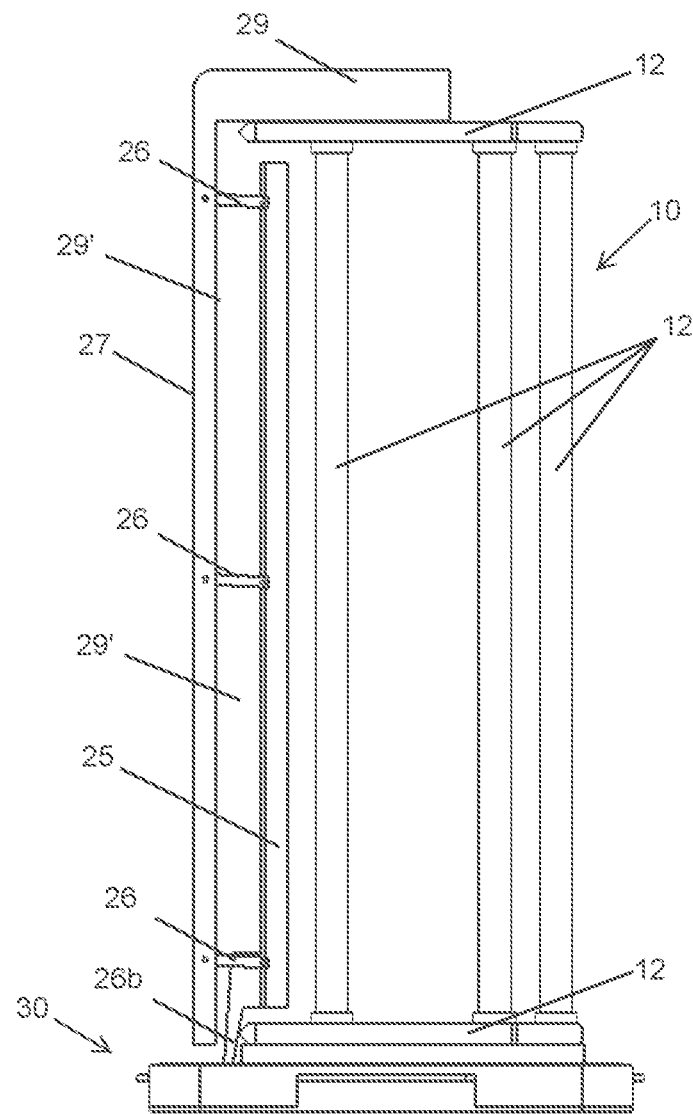
Figure 13A:
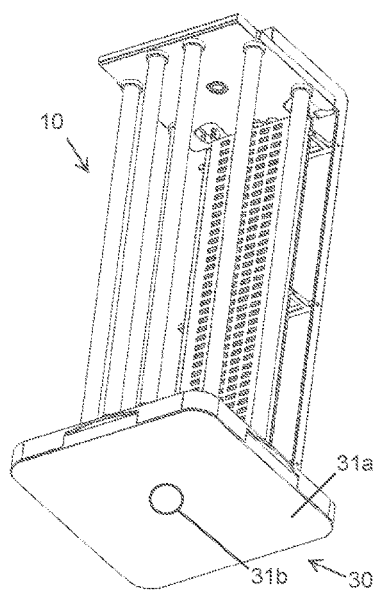
FIGS. 13A-13B illustrate a bottom view and an exploded bottom view, respectively, of a gear system in a pod base for effecting locking and release of the removable base with the cover of the solar cell carrying pod in accordance with various embodiments.
Figure 13B:
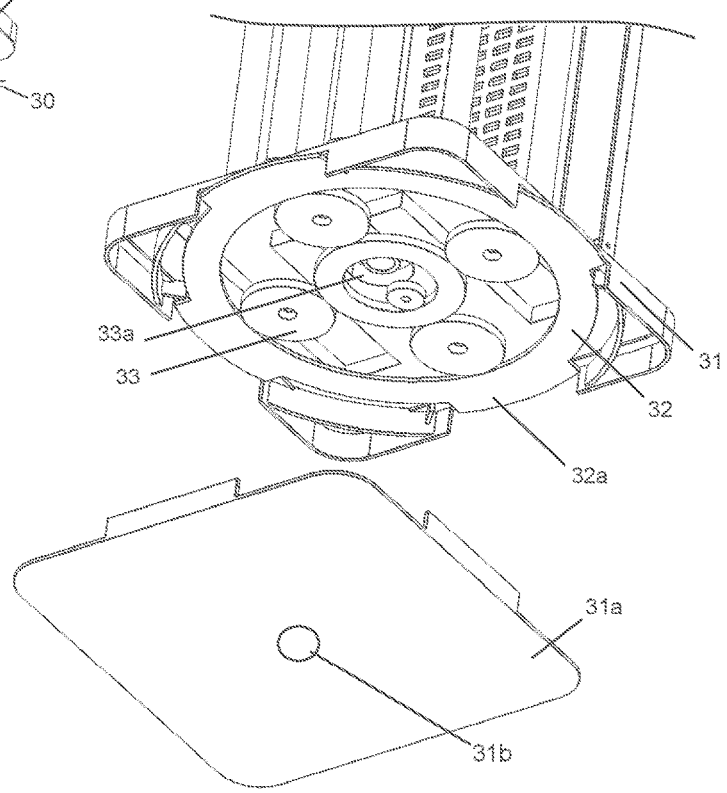

In another aspect, plenum diffuser 25 to function as a spacer. Plenum diffuser 25 is configured to move towards the solar cells within cassette 10 when cover 30 is coupled to cover 21 so as to occupy any additional space at the front of cassette 10 where solar cells 1 were loaded. Typically, plenum diffuser is configured to move towards the stack of solar cells so as to come in close proximity (e.g. about 1 mm or less) without contacting the solar cell stack. By occupying this space, plenum diffuser 25 prevents any undesired movement of the stack of solar cells that may inadvertently damage one or more solar cells. The above described movement of plenum diffuser 25 is provided by hinges 26 that couple plenum diffuser 25 to align mount 27. This movement is effected by engagement of bottom pins 25b extending downwards from plenum diffuser 25 towards pod base 30 so as to contact base 30 when coupled with cover 21 causing plenum diffuser 25 to swing upwards and towards the stack of solar cells. Additional detail views of these components are shown in FIGS. 12A-12C.

Figure 14:
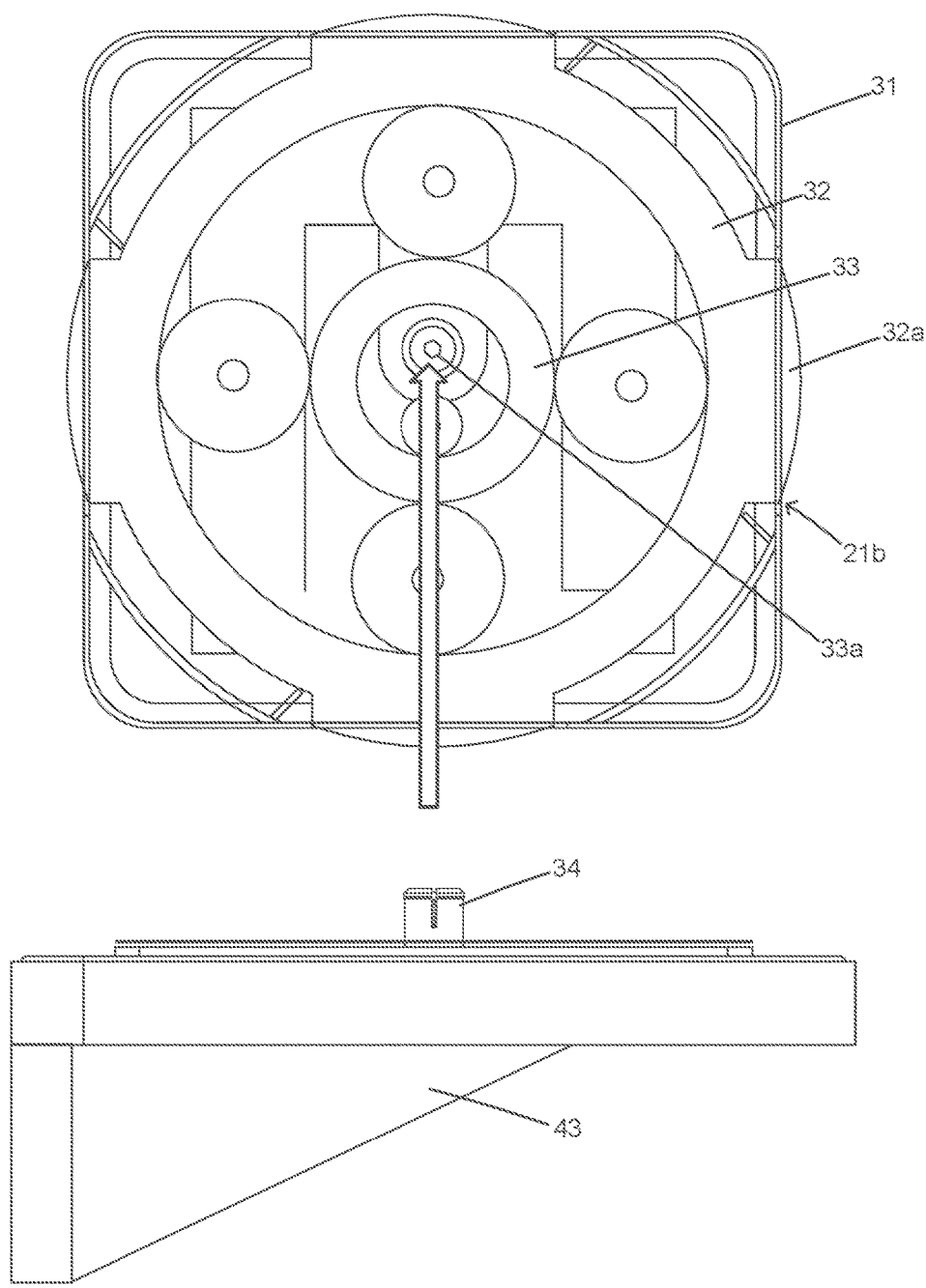
FIG. 14 illustrates a detail view of the gear system in an underside of the removable base of the solar cell carrying pod and an elevator platform of the tank receptacle having a motor-driven collet for operating the gear system of the solar cell carrying pod in accordance with various embodiments.
Figure 15A:
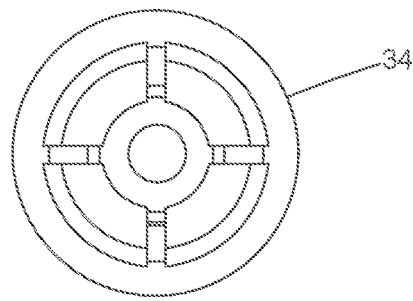
FIGS. 15A-15E illustrate detail views of the motor driven collet of the tank receptacle for operation of the gear system of the pod base in accordance with various embodiments.
Figure 15B:
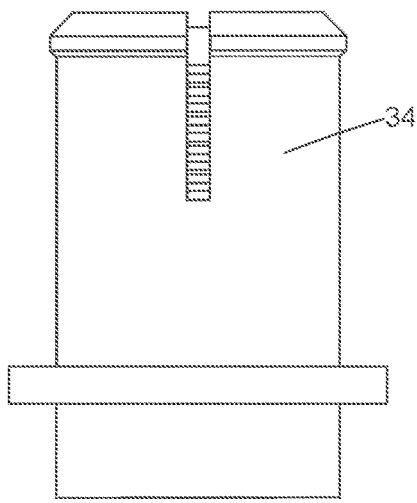
Figure 15D:
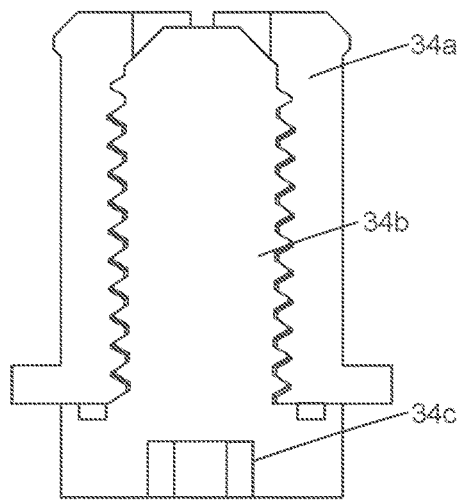
Figure 15C:
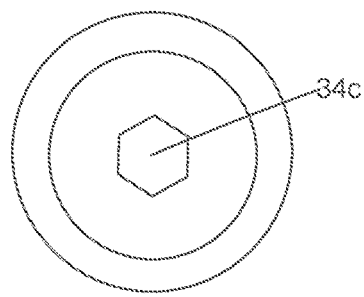
Figure 15E:
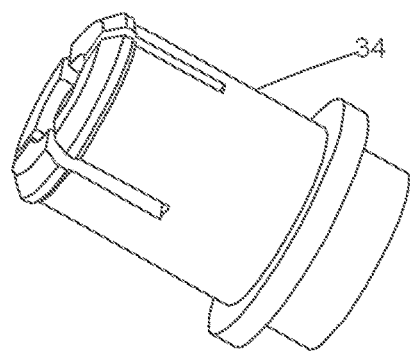

FIG. 14 illustrates the actuation mechanisms by which elevator platform 43 is coupled to and effects detachment and/or locking of pod base 30 to pod cover 21 in exemplary solar cell carrying pods 20. The actuation mechanism can be disposed within elevator platform 43 on which a respective pod base 30 is positioned by robotic arm 70. In this embodiment, the actuation mechanism is defined as collet 34, which extends upwards so as to be received within a corresponding collar 33a within gear system 33 of pod base 30. Motor-driven expansion and rotation of collet 34 circumferentially engages collar 33a and drives the gear system 33 so as to rotate locking ring 32 between an locked and unlocked position. Rotating collet 34 in one direction facilitates unlocking of pod base 30 from pod cover 21 while rotating collet 34 in the other direction facilitate locking of pod base 30 to pod cover. While in this embodiment collet 34 is used, it is appreciated that various other engagement mechanisms can be used to effect unlocking and locking of pod base 30 with pod cover 21.

Figure 16A:
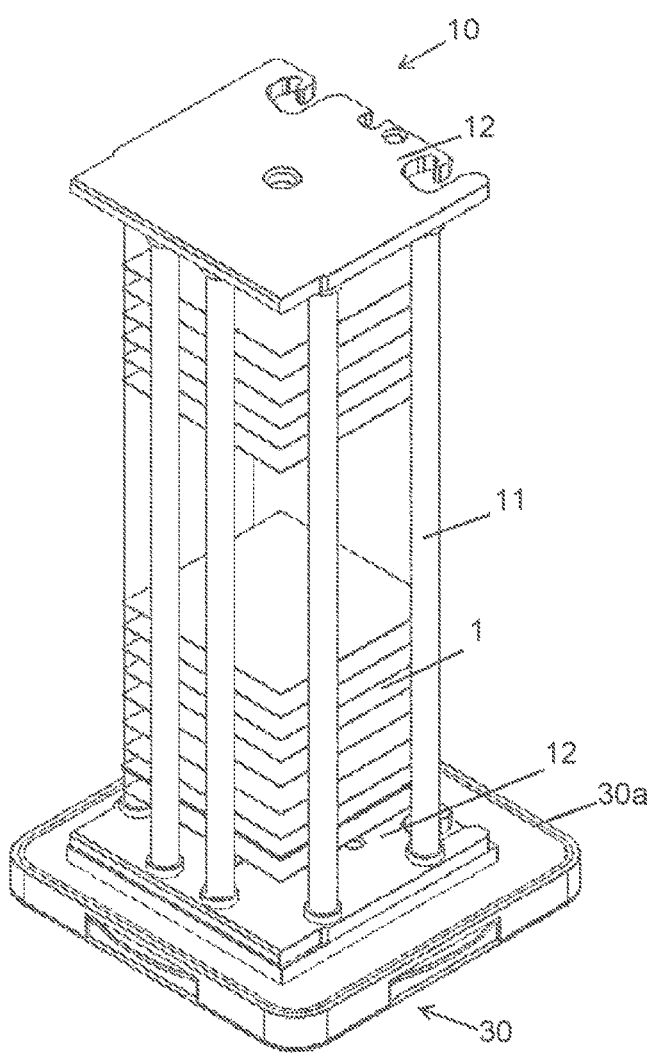
FIGS. 16A-16B illustrate a solar cell carrying cassette attached to a base for use in a solar cell carrying pod in accordance with various embodiments.
Figure 16B:
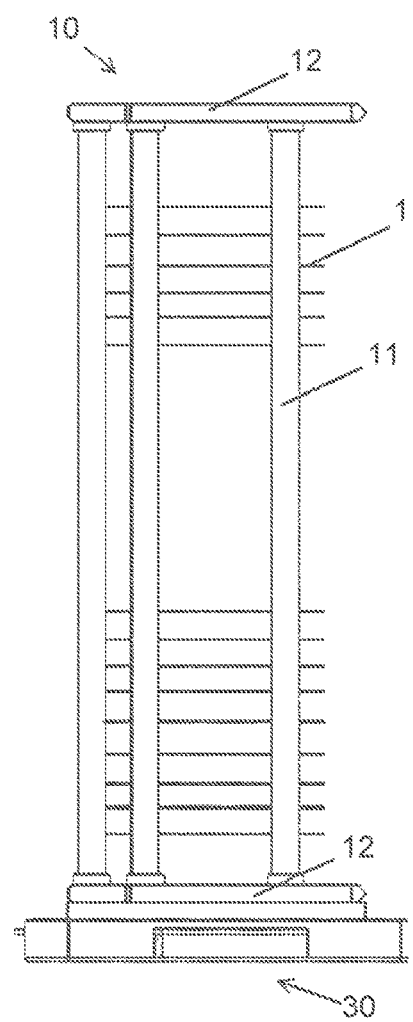

As shown in FIG. 14, locking ring 32 includes locking blades 32a that extend outside of pod base housing 31 when locking ring 32 is rotated to the locked position. When positioned as such while pod cover 21 is disposed atop cover 30, locking blades 32a engage a corresponding surface along bottom ridge 21a of pod cover 21, thereby securely coupling base 30 with pod cover 21 with sufficient force to sealingly couple base 30 and pod cover 21 together. Typically, as shown in FIG. 16A, there are one or more lip seals 30a circumscribing the top surface of pod base 30 for engaging a bottom facing surface of pod cover 21. When sealed, lips seals 30a can maintain the sealed environment within the pod at a slight positive pressure for days, weeks or months, typically about 60 days or more. When collet 34 is rotated to unlock base 30 from cover 21, gear system 33 effects rotation of locking ring 32 so that locking blades 32a are rotated and stored within pod base housing 31 in each rounded corner of base 30. In this position, locking ring 32 is no longer engaged with the bottom ridge of pod cover 21 such that pod base 30 is detached. Elevator base 34 can then be lowered with detached base 30 along with attached cassette 10 to facilitate unloading or loading of cassette 10 with solar cells as described, such as shown for example in FIGS. 5A-5D. An example of collet 34 is shown in FIGS. 15A-15E. Collet includes a spreadable collar 34a, an internal threaded bolt 34b and a proximal head 34c by which collet 34 can be driven by a mechanism disposed within elevator base 43. Rotation of threaded bolt 34 causes spreadable collar 34a to expand radially so as to securely engage a corresponding collar 33a within gear system 33 so that subsequent rotation of collet 34 drives gear system 33 to effect locking or unlocking of base 30 from cover 21 via rotation of locking ring 32.

Figures 17A, 17B:
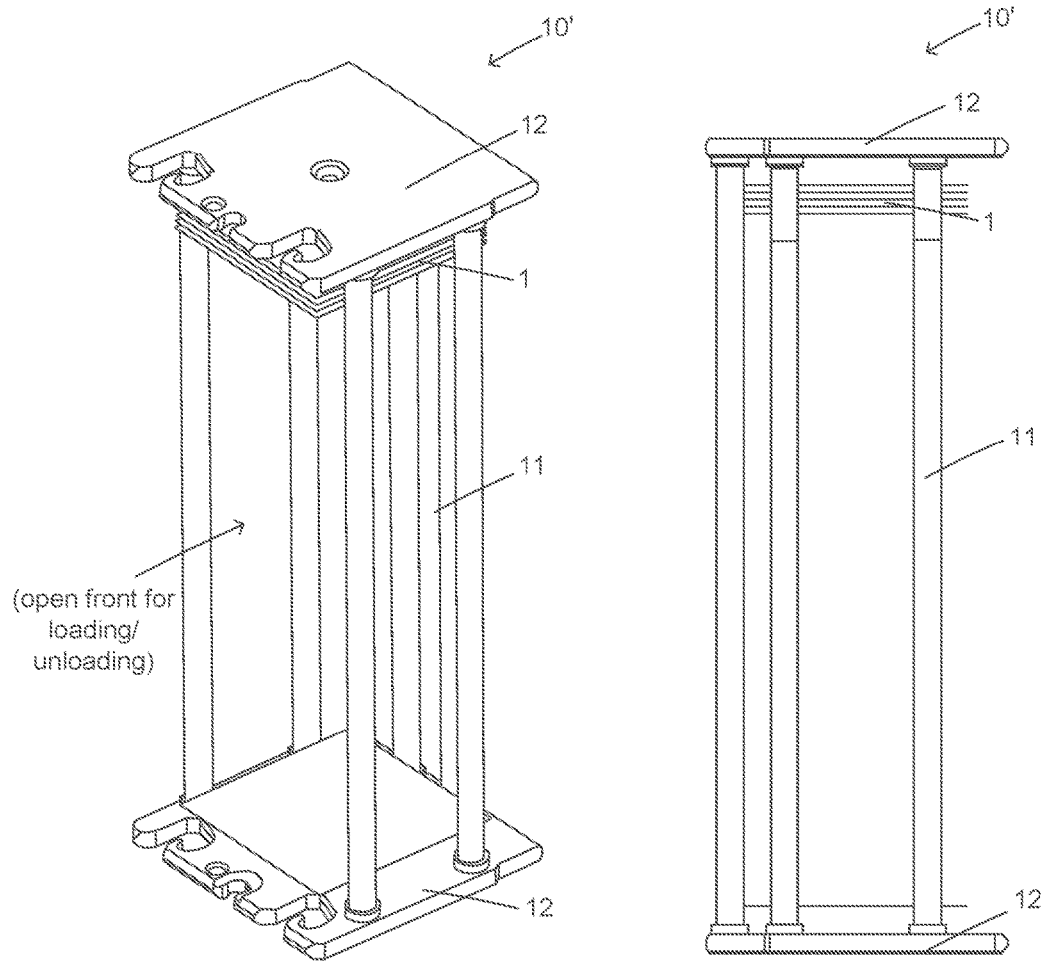
FIGS. 17A-17B and FIG. 18 illustrate another solar cell carrying cassette suitable for use in a solar cell carrying pod in accordance with various embodiments.
Figure 18:
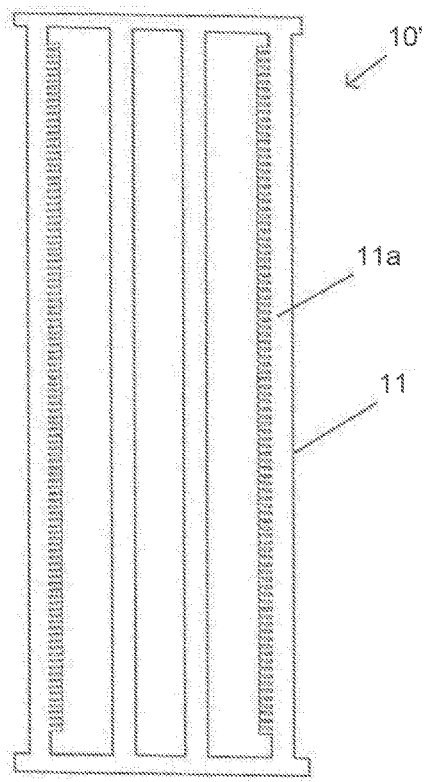

FIGS. 16A-16B and 17A-17B illustrate exemplary solar cell carrying cassettes 10 for use within solar cell carrying pods and transfer systems in accordance with various embodiments. Each cassette 10 typically includes pair of end plates 12 spaced apart by sets of rods 11 that form a framework defining an interior space for supporting a stack of solar cells. Typically, cassette 10 includes three pairs of rods 11 extending between edges of three sides of end plates 12 so as to define a square shaped space for supporting the stack of solar cells while leaving a front side of the space open for loading and unloading of the solar cells from the stack. Rods 12 typically include support features 11 for supporting each of the solar cells within a stack, such that in combination, the pairs of rods define a number of spaced apart shelf positions along which solar cells can be inserted or withdrawn. It is appreciated that the support features 11 can be spaced apart to allow more space between each adjacent solar cell within the stack, as shown in FIG. 16A, or can be closer to allow relatively little space between adjacent solar cell components within a stack, as shown in FIG. 17A.

Figure 20:
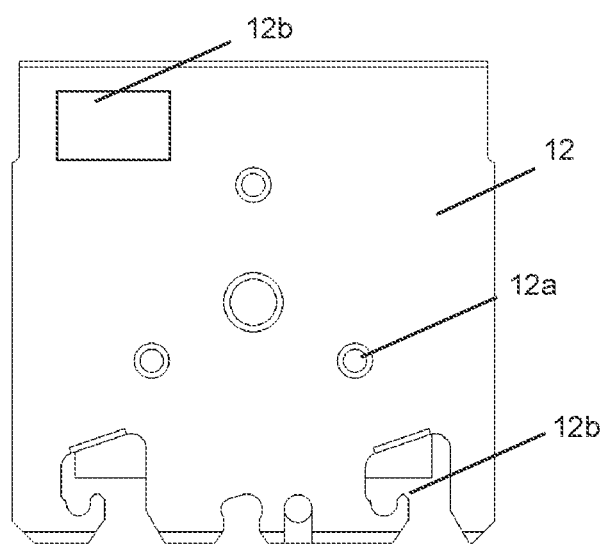
FIG. 20 illustrates an example end plate of a solar cell carrying cassettes for use in a solar cell carrying pod and transfer system in accordance with various embodiments.
Figure 21:
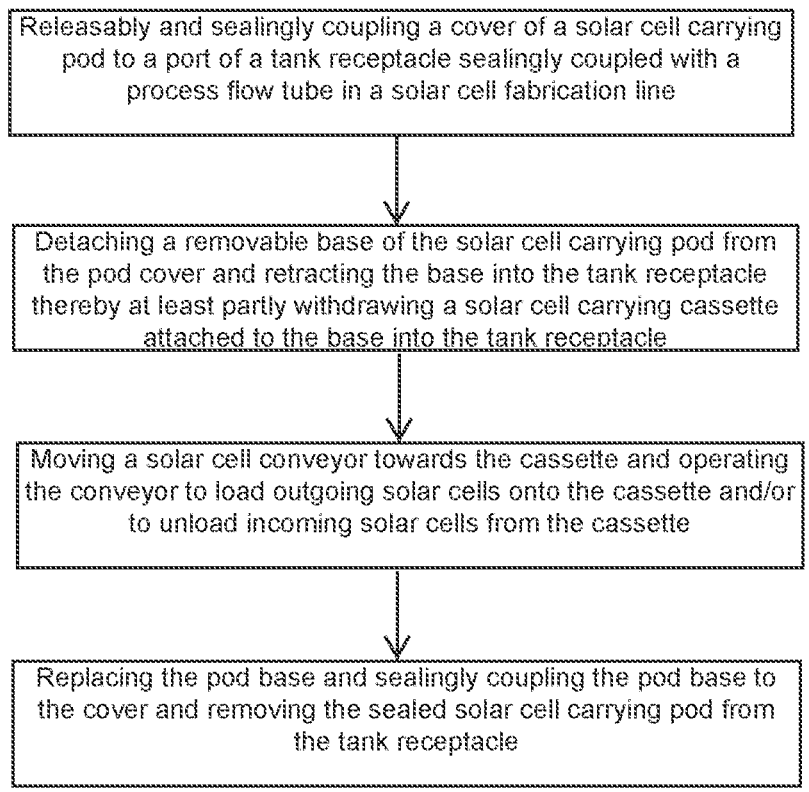
FIG. 21 illustrates a method in accordance with various embodiments.

The support features can include any feature suitable for supporting a solar cell. For example, such support features can be defined as an L-shaped support 11a, a shelf-like support 11b, or a recess or notch 11c. Different features may be desirable depending on the stage of fabrication of the solar cell component being supported. For example, in a relatively early stage of fabrication, when the solar cell component is relatively fragile and may include developer residue along the edges, the L-shaped support in 11a may be desirable as it avoids contacts and associated stresses being applied at the extreme edges of the solar cell component. FIG. 20 illustrates an exemplary end plate 12 for use in an exemplary cassette. Each end plate 12 is formed of a material suitable for use in a cassette used for storing solar cells. Typically, end plates 12 and rods 11 are each formed of a metal, such as stainless steel, that provides sufficient strength for use in a cassette while being resistant to various chemicals used in the solar cell fabrication process. It is appreciated that these components may also be formed of polymers or combination of materials as desired.

As shown in FIG. 20, end plate 12 can include various alignment features 12a, such as holes or openings dimensioned and arranged to engage with corresponding features in pod base 30 and ensure cassette 10 is properly aligned and coupled. In addition, notched features 12b on one side of endplate can also be used to orient or couple the end plates or to facilitate handling or transport of the cassette during various other processes or uses, such as cleaning.

Each end plate can also include an identification features 12b that can be used by system to identify a particular cassette 10 and associated solar cells, or may be used to confirm the presence of cassette 10 within pod. Such identification feature 12b can include a barcode, RFID chip, or any other suitable feature suitable for identification. In one aspect, an RFID chip is advantageous as it allows cassette 10 to be readily identified by the system even when sealed within pod 20 where other identification features may be obscured from view. It is appreciated that such features can be defined in various other location, shapes and numbers as desired for a particular function or application.

FIG. 20 illustrates an exemplary method of transferring solar cells from a fabrication and one or more solar cell storage pods in accordance with various embodiments. The method includes first releasably and sealingly coupling a cover of a solar cell carrying pod to a port of a tank receptacle sealingly coupled with a process flow tube in a solar cell fabrication line. A removable base of the solar cell carrying pod is then detached from the pod cover and retracted the base into the tank receptacle thereby at least partly withdrawing a solar cell carrying cassette attached to the base into the tank receptacle. In various embodiments, the tank receptacle includes at least two ports, an incoming port for unloading incoming solar cells and an outgoing port for loading outgoing solar cells. In such embodiments, the method can include concurrently loading and unloading solar cells through the respective ports as described above. A solar cell conveyor is then moved towards the cassette and operating the conveyor to load outgoing solar cells onto the cassette and/or to unload incoming solar cells from the cassette. The pod base is then replacing the pod base and sealingly coupling the pod base to the cover and removing the sealed solar cell carrying pod from the tank receptacle.

The embodiments of the present inventions should not be limited in scope by the embodiments described herein. Indeed, various modifications of the embodiments of the present inventions, in addition to those described herein, will be apparent to those of ordinary skill in the art from the foregoing description and accompanying drawings and claims. Thus, such modifications are intended to fall within the scope of this invention. Further, although some of the embodiments of the present invention have been described herein in the context of a particular implementation in a particular environment for a particular purpose, those of ordinary skill in the art will recognize that its usefulness is not limited thereto and that the embodiments of the present inventions can be beneficially implemented in any number of environments for any number of purposes. Accordingly, this disclosure should be construed in view of the full breath and spirit of the embodiments disclosed herein and claimed below.

What is claimed is:

1. A solar cell transfer system comprising:
 a receptacle sealingly coupleable with a tube through which solar cell components are conveyed in a solar cell fabrication process flow, wherein the receptacle includes one or more ports, each port sealingly coupleable with a solar cell carrying pod to facilitate transport of one or more solar cells between the solar cell carrying pod and the solar cell fabrication process flow;
 an elevator associated with each of the one or more ports, each elevator being adapted to securely couple with a removable base of the solar cell carrying pod and withdraw the removable base and a solar cell carrier cassette attached to the removable base into the receptacle to facilitate transport of the one or more cells between the cassette and the solar cell fabrication process flow;
 a movable conveyor associated with each of the one or more ports, the conveyor configured to extend towards the cassette after withdrawal of the removable base into the receptacle and to convey the one or more solar cells resting thereon to facilitate transport of the one or more cells between the cassette and the solar cell fabrication process flow;
 a controller configured to control movement of each of the conveyor and the elevator such that movement of the elevator coordinated with conveying movement of the conveyor extended towards the cassette effects transport of the one or more cells between the cassette and the solar cell fabrication process flow through the tube;
 a plurality of designated staging tracks including a first staging track configured to transfer solar cell carrying pods loaded with solar cells incoming into the solar cell fabrication process flow, a second staging track configured to transfer solar cell carryings pods loaded with solar cells outgoing from the solar cell fabrication process flow for storage, and a third staging track configured to transfer empty solar cell carrying pods; and
 a robotic arm having a gripper configured to place any of a plurality of solar cell carrying pods cell on a respective port of the one or more ports of the receptacle, wherein the robotic arm is configured to automatically transfer solar cell carrying pods between any of the designated staging tracks and a respective port to facilitate repeated large-scale loading and unloading of outgoing and incoming solar cells from the solar cell fabrication process flow tube.

2. The solar cell transfer system of claim 1, wherein the elevator includes an actuator positioned on an elevator platform to engage one or more gears of the removable base to effect removal and/or replacement of the base from the solar cell carrying pod.

3. The solar cell transfer system of claim 2, wherein the actuator comprises a motor-driven collet adapted to expand into a rotatable collar operably coupled with a gear system within the removable base that effects removal and/or replacement of the base of the solar cell carrying pod.

4. The solar cell transfer system of claim 3, wherein the collet is incorporated into the movable elevator platform.

5. The solar cell transfer system of claim 1, wherein the one or more ports includes:

an incoming port for transferring the one or more incoming solar cells from a respective solar cell carrying pod, and an outgoing port for transferring the one more solar cells outgoing to a respective solar cell carrying pod.

6. The solar cell transfer system of claim 1, wherein the gripper comprises at least two distally extending gripper jaws adapted to close on a handle disposed atop the solar cell carrying pod, wherein the at least two gripper jaws are movable between an open position for receiving the handle and a closed position for grasping the handle, wherein movement of the gripper jaws is effected by a gripper actuation mechanism.

7. The solar cell transfer system of claim 6, the wherein the at least two gripper jaws are biased in the open position and the actuation mechanism comprises a sleeve that slides over the at least two gripper jaws so as to move the at least two gripper jaws towards each other as the sleeve is distally advanced.

8. The solar cell transfer system of claim 7, wherein the gripper actuation mechanism is configured such that movement of the sleeve is pneumatically actuated.

9. The solar cell transfer system of claim 6, wherein the gripper further includes a nozzle adapted to sealingly couple with a valve disposed atop the solar cell carrying pod to facilitate maintaining a controlled environment within the solar cell carrying pod.

10. The solar cell transfer system of claim 9, wherein the nozzle includes an circumferential seal along a distal nozzle opening for sealing against a valve boss surrounding the valve when the gripper is coupled with the handle of the solar cell carrying pod.

11. The solar cell transfer system of claim 1, further comprising:
a lip seal circumscribing each of the one or more ports to facilitate sealing of a cover of the solar cell carrying pod with the respective port.

12. The solar cell transfer system of claim 11, further comprising:
a clamp mechanism disposed on a receptacle housing adjacent each of the one or more ports, wherein each clamp mechanism includes a finger that pressingly engages an outer surface of the solar pod sufficiently to seal the cover against the receptacle housing about the port.

13. The solar cell transfer system of claim 12, wherein each clamp mechanism comprises:
a base attached to a housing of the receptacle,
a movable arm pivotally coupled to the base; and
a rod extending distally from the movable arm and defining the finger for engaging the outer surface of the respective solar cell carrying pod.

14. The solar cell transfer system of claim 1, further comprising:
one or more sensors for determining a status and/or location of a respective solar cell carrying pod or the removable base of the respective solar cell carrying pod relative the respective port, wherein an output of each of the one or more sensors is coupled with the control unit such that movement of the removable base into the receptacle and/or movement of the conveyor is based on data from the one or more sensors.

15. The solar cell transfer system of claim 14, wherein the one or more sensors includes any of:
a first sensor adapted for determining when a solar cell carrying pod is sealingly coupled to the port;

a second sensor adapted for determining a location of a cassette attached to the removable base of a respective solar cell carrying pod when withdraw into the receptacle; and a third sensor adapted for determining a location of a respective solar cell of the one or more solar cells during unloading from a cassette and/or loading onto a cassette, or any combination thereof.

16. A solar cell transfer system comprising:
a receptacle sealingly coupleable with a tube through which solar cell components are conveyed in a solar cell fabrication process flow, wherein the receptacle includes one or more ports, each port sealingly coupleable with a solar cell carrying pod to facilitate transport of one or more solar cells between the solar cell carrying pod and the solar cell fabrication process flow;
an elevator associated with each of the one or more ports, each elevator being adapted to securely couple with a removable base of the solar cell carrying pod and withdraw the removable base and a solar cell carrier cassette attached to the removable base into the receptacle to facilitate transport of the one or more cells between the cassette and the solar cell fabrication process flow;
a movable conveyor associated with each of the one or more ports, the conveyor configured to extend towards the cassette after withdrawal of the removable base into the receptacle and to convey the one or more solar cells resting thereon to facilitate transport of the one or more cells between the cassette and the solar cell fabrication process flow; and
wherein the system is configured to control movement of each of the conveyor and the elevator such that movement of the elevator coordinated with conveying movement of the conveyor extended towards the cassette effects transport of the one or more cells between the cassette and the solar cell fabrication process flow through the tube;
a plurality of designated staging tracks including a first staging track configured to transfer solar cell carrying pods loaded with solar cells incoming into the solar cell fabrication process flow, a second staging track configured to transfer solar cell carryings pods loaded with solar cells outgoing from the solar cell fabrication process flow for storage, and a third staging track configured to transfer empty solar cell carrying pods; and
a robotic arm having a gripper configured to place any of a plurality of solar cell carrying pods cell on a respective port of the one or more ports of the receptacle, wherein the robotic arm is configured to automatically transfer solar cell carrying pods between any of the designated staging tracks and a respective port to facilitate repeated large-scale loading and unloading of outgoing and incoming solar cells from the solar cell fabrication process flow tube.

17. The system of claim 16, wherein the system is configured to automatically convey a plurality of solar pods to particular positions along the respective staging racks to facilitate repeated loading and unloading of large volumes of solar cell carrying pods with the robotic arm.

18. The system of claim 16,
wherein the one or more conveyors comprise an incoming and an outgoing conveyor, and the one or more ports comprise an incoming port and an outgoing port, the incoming and outgoing conveyor being configured for conveying solar cells incoming and outgoing from the solar cell fabrication process tube for unloading at the incoming port and for loading at the outgoing port, respectively, wherein the incoming and outgoing conveyor are adjacent each other within the tank receptacle attached to the solar cell fabrication process tube.

19. The system of claim 16, wherein the one or more ports comprise a single port, wherein the system is configured to facilitate loading and unloading of outgoing and incoming solar cells, respectively, from the process flow tube at the single port.

* * * * *